US007920195B2

(12) United States Patent
Yuki et al.

(10) Patent No.: US 7,920,195 B2
(45) Date of Patent: Apr. 5, 2011

(54) IMAGE SENSING APPARATUS HAVING AN EFFECTIVE PIXEL AREA

(75) Inventors: Osamu Yuki, Tokyo (JP); Noriyuki Kaifu, Tokyo (JP); Kazuaki Tashiro, Kanagawa (JP); Tetsunobu Kochi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/427,437

(22) Filed: Apr. 21, 2009

(65) Prior Publication Data

US 2009/0230310 A1 Sep. 17, 2009

Related U.S. Application Data

(62) Division of application No. 11/289,614, filed on Nov. 30, 2005, now Pat. No. 7,639,295, which is a division of application No. 09/912,341, filed on Jul. 26, 2001, now Pat. No. 7,071,980.

(30) Foreign Application Priority Data

Jul. 27, 2000 (JP) ................................. 2000-227333
Aug. 2, 2000 (JP) ................................. 2000-234829

(51) Int. Cl.
 *H04N 3/15* (2006.01)
 *H04N 5/335* (2006.01)
(52) U.S. Cl. ...................................................... 348/308
(58) Field of Classification Search .................. 348/308; 257/208.1, 291, 292, 293, 294
See application file for complete search history.

(56) References Cited

U.S. PATENT DOCUMENTS

| 4,323,925 | A |   | 4/1982  | Abeil et al. ................... 358/213 |
|-----------|---|---|---------|-----------------------------------------|
| 5,294,787 | A | * | 3/1994  | Kihara et al. ............... 250/208.1  |
| 5,315,101 | A |   | 5/1994  | Hughes et al. .............. 250/208.1   |
| 5,464,984 | A |   | 11/1995 | Cox et al. .................. 350/307.11 |
| 5,485,204 | A |   | 1/1996  | Taniji ............................ 348/264 |
| 5,576,760 | A |   | 11/1996 | Akiyama .................. 348/231.99    |
| 5,877,501 | A |   | 3/1999  | Ivan et al. ................. 250/370.09 |
| 5,896,172 | A |   | 4/1999  | Korthout et al. ............... 348/312  |
| 5,901,254 | A |   | 5/1999  | Iguchi et al. ................... 382/298 |
| 5,949,483 | A |   | 9/1999  | Fossum et al. ................. 348/303  |
| 6,005,911 | A |   | 12/1999 | Cheung ........................... 378/37 |
| 6,087,685 | A | * | 7/2000  | Harada .......................... 257/232 |
| 6,137,100 | A |   | 10/2000 | Fossum et al. .............. 250/208.1   |
| 6,166,367 | A |   | 12/2000 | Cho .............................. 348/302 |

(Continued)

FOREIGN PATENT DOCUMENTS

EP     0 346 102 A2   12/1989

(Continued)

OTHER PUBLICATIONS

European Examination Report dated Jun. 15, 2010, from corresponding European Application No. 01306425.8.

*Primary Examiner* — Jason Whipkey
(74) *Attorney, Agent, or Firm* — Fitzpatrick, Cella, Harper & Scinto

(57) ABSTRACT

An image sensing apparatus provided with a plurality of image sensing elements each including a plurality of photoelectric conversion sections and an adding circuit adapted to add signals from the plurality of photoelectric conversion sections to obtain a one-pixel signal, wherein the adding circuit adds the signals such that the one-pixel signals obtained by the addition are arranged at equal intervals in an area extending over the plurality of image sensing elements.

10 Claims, 26 Drawing Sheets

EDGE PORTION
OF IMAGE SENSING
ELEMENT

U.S. PATENT DOCUMENTS

| | | | |
|---|---|---|---|
| 6,255,638 B1 | 7/2001 | Eraluoto et al. | 348/308 |
| 6,552,319 B2 | 4/2003 | Pyyhtia et al. | 348/308 |
| 6,567,571 B1 | 5/2003 | Kochi et al. | 382/312 |
| 6,573,507 B1 | 6/2003 | Agano | 250/370.09 |
| 6,587,603 B1 | 7/2003 | Sakurai et al. | 382/312 |
| 6,650,369 B2 | 11/2003 | Koizumi et al. | 348/301 |
| 7,071,980 B2 | 7/2006 | Yuki et al. | 348/308 |
| 7,129,985 B1 | 10/2006 | Koizumi et al. | |
| 2005/0248675 A1* | 11/2005 | Hashimoto et al. | 348/308 |

FOREIGN PATENT DOCUMENTS

| | | |
|---|---|---|
| EP | 0346102 | 12/1989 |
| JP | 5-218814 | 8/1993 |
| JP | 07046608 A | 2/1995 |
| JP | 9-223948 | 8/1997 |
| JP | 11112888 A | 4/1999 |
| WO | WO 99/31874 | 6/1999 |
| WO | 99/65248 | 12/1999 |
| WO | WO 00/17930 | 3/2000 |

* cited by examiner

PRIOR ART  FIG. 1

EDGE PORTION OF
IMAGE SENSING
ELEMENT

EDGE PORTION OF IMAGE SENSING ELEMENT

IMAGE SENSING APPARATUS HAVING AN EFFECTIVE PIXEL AREA

RELATED APPLICATIONS

This application is a division of co-pending application Ser. No. 11/289,614, filed Nov. 30, 2005, which is a division of U.S. patent application Ser. No. 09/912,341 filed Jul. 26, 2001 (now U.S. Pat. No. 7,071,980 dated Jul. 4, 2006), which are incorporated by reference herein in their entirety, as if fully set forth herein, and claims the benefit of priority under 35 U.S.C. §119, based on Japanese Priority Application Nos. JP 2000-227333, filed Jul. 27, 2000, and JP 2000-234829, filed Aug. 2, 2000, which are incorporated by reference herein in their entirety, as if fully set forth herein.

BACKGROUND OF THE INVENTION

1. Field of the Invention

The present invention relates to an image sensing apparatus for sensing an object image.

2. Related Background Art

Digitalization has advanced in various medical fields. A two-dimensional image sensing apparatus has been developed for digitization of images in the field of the X-ray diagnosis as well. A large image sensing apparatus with a maximum length of 43 cm has been manufactured for sensing breasts and chests.

One conventional art will be described.

A large X-ray image sensing apparatus is realized by tessellating four sensor panels, which use amorphous silicon semiconductors on a glass substrate whose size can easily be enlarged. A technology for enlarging a size of an amorphous silicon semiconductor apparatus (technology for forming a large substrate and an element thereon, or the like) which has already been established in the field of LCDs is used. As an example of this type of technology, there is one described in U.S. Pat. No. 5,315,101. A large area active array matrix described in the patent is shown in FIG. 1. Referring to FIG. 1, reference numeral 1901 denotes substrates, 1902 denotes pixels, 1903 denotes connection lead and 1904 denotes common terminals.

Another conventional art will be described next.

There is a technology for manufacturing a large X-ray image sensing apparatus using a plurality of monocrystal image sensing element (silicon or the like). As an example of this type of technology, there are ones described in U.S. Pat. Nos. 4,323,925 and 6,005,911. As a monocrystal image sensing element, there are a CCD image sensing element, an MOS type or a CMOS type image sensing element or the like. A single image sensing element has a sufficient capability to handle an X-ray motion image.

An image sensor described in U.S. Pat. No. 4,323,925 is shown in FIG. 2. Referring to FIG. 2, reference numeral 2001 denotes an object, 2002 denotes a lens, 2003 denotes an image of the subject, 2004 denotes a surface, 2005 denotes continuous optical sub-images, 2006 denotes taper-shaped FOPs (fiber optic plates), 2007 denotes image input surfaces, 2008 denotes image sensor modules, 2009 denotes non-image forming peripheral areas and 2010 denotes leads. Since the optical sub-images 2005 are reduced in size by the taper-shaped FOP 2006 to be incident on the image input surfaces 2007, the non-image sensing peripheral areas 2009 are provided, to which the leads are connected.

However, the former conventional art has the following problems.

In order to form one image, only 4 pieces (2×2) sensor panels can be used at the most. This is because the image sensor has a configuration in which external terminals are provided in the external circumference of the sensor panels and a circuit for driving the sensor panels are externally connected thereto.

In addition, a size of a signal processing circuit that can be mounted on an image sensing element is limited to a such degree that the element can only have a pixel selection switch at the most. The signal processing circuit (a driver, an amplifier or the like) is externally attached.

Moreover, since an amorphous silicon does not have a good semiconductor property with respect to a high-speed operation, it is difficult to manufacture a large image forming apparatus for handling moving images. In addition, since an amorphous silicon image forming element has lower sensitivity compared with a monocrystal silicon image forming element, it is difficult to make it able to handle X-ray moving images that require high sensitivity.

In addition, the latter conventional art has the following problems.

Since the size of individual image forming element is small (in the present technology, the size of 8 inches is the largest for a wafer), 2×2 or more pieces of sensor panels are required.

In addition, a dead space is always formed in a part for joining each image sensing element in a configuration of a simple large image sensing apparatus that uses multiple monocrystal image sensing elements (areas for providing peripheral circuits such as a shift register and an amplifier, external terminals for exchanging signals and power with the outside and a protective circuit are always necessary in addition to pixel areas). This part of the dead space becomes a line defect, which lowers the image quality. Thus, light from a scintillator is guided to the image sensing elements while avoiding the dead space using taper-shaped FOPs (fiber optic plates). However, this requires extra FOPs and increases manufacturing costs. In particular, the taper-shaped FOPs are very costly.

Moreover, in the taper-shaped FOPs, the light from the scintillator tends not to be incident on the FOPs depending on a taper angle, which causes the decrease of an output light amount to offset sensitivity of the image sensing elements and lower the overall sensitivity of the apparatus.

SUMMARY OF THE INVENTION

It is an object of the present invention to realize a high quality image when an object image is sensed over a plurality of sensing areas.

In order to attain the above-mentioned object, according to one aspect of the present invention, there is provided an image sensing apparatus for sensing an image by arranging a plurality of image sensing elements each including a plurality of photoelectric conversion sections, comprising an adding circuit adapted to add signals from the plurality of photoelectric conversion sections to obtain a one-pixel signal, wherein the adding circuit adds the signals such that the one-pixel signals obtained by the addition are arranged at equal intervals in an area extending over the plurality of image sensing elements.

In addition, according to another aspect of the present invention, there is provided an image sensing apparatus for sensing an image by arranging a plurality of image sensing elements each including a plurality of photoelectric conversion sections, comprising an adding circuit adapted to add signals from the plurality of photoelectric conversion sections to obtain a one-pixel signal, wherein each photoelectric conversion section is arranged such that the one-pixel signals obtained by the addition is arranged at equal intervals in an area extending over the plurality of image sensing elements.

In addition, according to still another aspect of the present invention, there is provided an image sensing apparatus including a plurality of image sensing areas each including a plurality of photoelectric conversion sections, and a plurality of output sections for outputting a signal on an each image sensing area basis, for sensing an image extending over the plurality of image sensing areas, comprising an image processing circuit adapted to perform a processing so as to obtain an image from a first one-pixel signal obtained by adding signals from the plurality of photoelectric conversion sections extending over the plurality of image sensing areas and a second one-pixel signal obtained from each photoelectric conversion section.

In addition, according to still another aspect of the present invention, there is provided an image sensing apparatus which includes a plurality of image sensing areas each including a plurality of photoelectric conversion sections, and a plurality of output sections for outputting a signal for each image sensing area, for sensing an image extending over the plurality of image sensing areas, comprising an adding circuit adapted to, when signals from the plurality of photoelectric conversion sections are added to obtain a one-pixel signal, add the signals from the plurality of photoelectric conversion sections extending over the plurality of image sensing areas to obtain the one-pixel signal.

In addition, according to still another aspect of the present invention, there is provided an image sensing apparatus for sensing an image by arranging a plurality of image sensing areas, wherein each image sensing area is provided with a plurality of photoelectric converting elements and each photoelectric converting element is provided with a photoelectric conversion section; and wherein scanning circuits are arranged inside the photoelectric conversion sections of parts of the photoelectric converting elements and centroids of the photoelectric conversion sections in which the scanning circuits are arranged and centroids of the photoelectric conversion sections in which the scanning circuits are not arranged are arranged at equal intervals.

In addition, according to still another aspect of the present invention, there is provided an image sensing apparatus for sensing an image by arranging a plurality of image sensing areas including a plurality of photoelectric conversion sections, wherein each of the plurality of image sensing areas includes a first area in which scanning circuits are arranged between photoelectric converting areas and a second area in which the scanning circuit is not arranged between the photoelectric converting areas, and wherein centroids of the photoelectric conversion sections of the first area and centroids of the photoelectric conversion sections of the second area are arranged at equal intervals.

In addition, according to still another aspect of the present invention, there is provided an image sensing apparatus for sensing an image by arranging a plurality of image sensing areas, wherein each image sensing area is provided with a plurality of photoelectric converting elements and each photoelectric converting element is provided with a photoelectric conversion section, and wherein common processing circuits for selectively outputting to the outside signals from a vertical output line to which signals from the plurality of photoelectric converting elements in the vertical direction are read out, via a horizontal output line are arranged inside the photoelectric conversion sections of parts of the photoelectric converting elements, and centroids of the photoelectric conversion sections in which the common processing circuits are arranged and centroids of the photoelectric conversion sections in which the common processing circuits are not arranged are arranged at equal intervals.

In addition, according to still another aspect of the present invention, there is provided an image sensing apparatus for sensing an image by arranging a plurality of image sensing areas each including a plurality of photoelectric conversion sections, wherein each of the plurality of image sensing areas includes a first area in which common processing circuits for selectively outputting to the outside signals from a vertical output line to which signals from the plurality of photoelectric conversion sections in the vertical direction are read out, via a horizontal output line are arranged between the photoelectric converting areas, and a second area in which the common circuits are not arranged between the photoelectric converting areas, and wherein centroids of the photoelectric conversion sections of the first area and centroids of the photoelectric conversion sections of the second area are arranged at equal intervals.

In addition, according to still another aspect of the present invention, there is provided an image sensing apparatus for sensing an image by arranging a plurality of image sensing areas, wherein each image sensing area is provided with a plurality of photoelectric converting elements and each photoelectric converting element is provided with photoelectric conversion sections, and wherein light shielding sections are arranged inside the photoelectric conversion sections of parts of the photoelectric converting elements and centroids of the photoelectric conversion sections in which the light shielding sections are arranged and centroids of the photoelectric conversion sections in which the light shielding sections are not arranged are arranged at equal intervals.

In addition, according to still another aspect of the present invention, there is provided an image sensing apparatus for sensing an image by arranging a plurality of image sensing areas, wherein each image sensing area is provided with a plurality of photoelectric converting elements and each photoelectric converting element is provided with photoelectric conversion sections, and wherein light shielding sections are arranged inside the photoelectric conversion sections of the plurality of photoelectric converting elements and centroids of the photoelectric conversion sections in which the light shielding sections are arranged are arranged at equal intervals.

Moreover, according to another aspect of the present invention, there is provided an image sensing apparatus for sensing an image by arranging a plurality of image sensing areas each including a plurality of photoelectric conversion sections, wherein each of the plurality of image sensing areas includes a first area in which scanning circuits and/or common processing circuits for selectively outputting signals from a vertical output line to which signals from the plurality of photoelectric conversion sections in the vertical direction are read out, to a horizontal output line are arranged between the photoelectric converting areas and a second area in which the scanning circuits and the common circuits are not arranged between the photoelectric converting areas, and wherein light shielding sections are arranged such that centroids of the photoelectric conversion sections of the first area and centroids of the photoelectric conversion sections of the second area are arranged at equal intervals.

Other objects, features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Embodiments of the present invention will be hereinafter described in detail with reference to the drawings.

First, items common to first to twelfth embodiments will be described.

Figure 1:
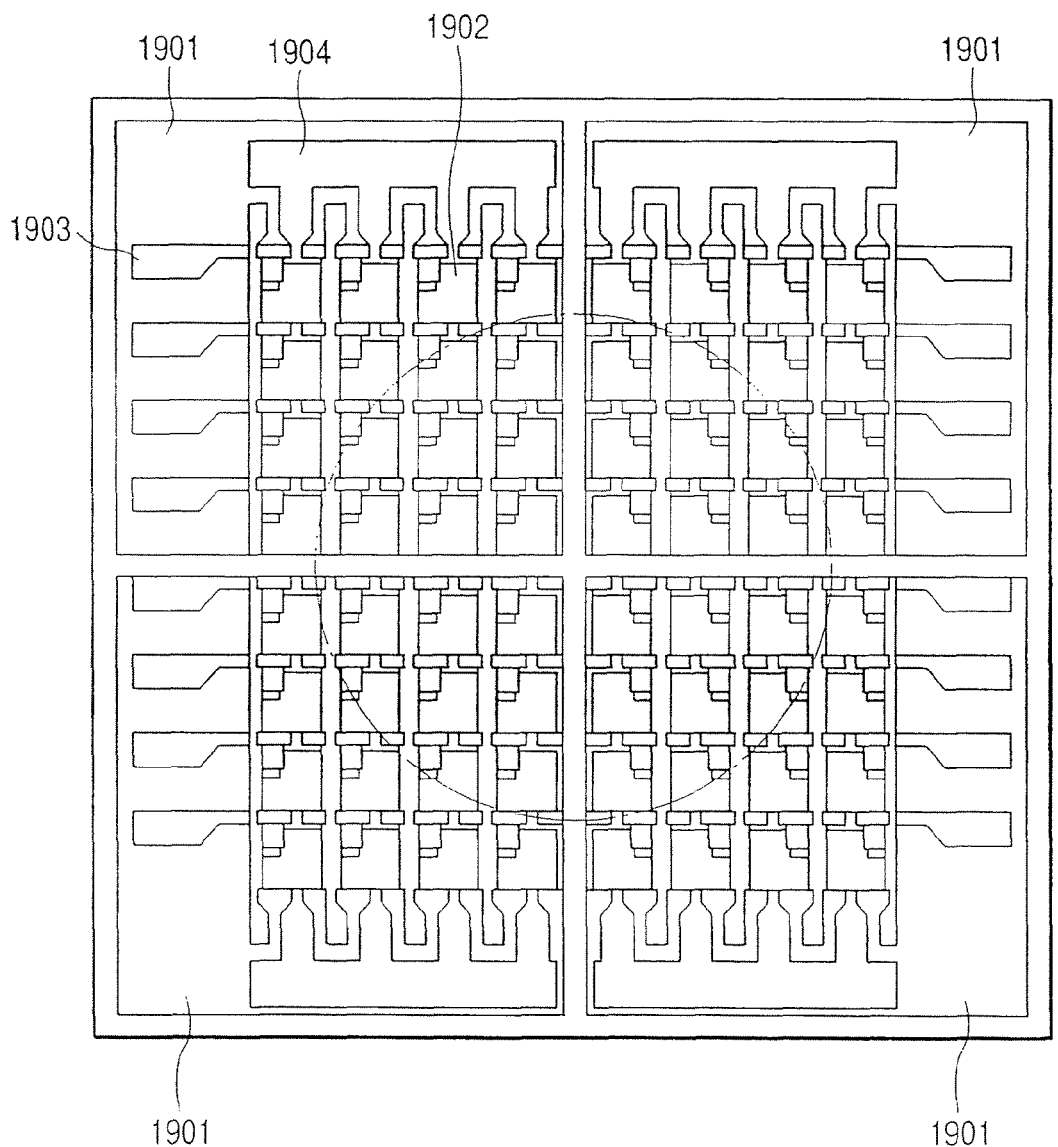
FIG. 1 illustrates an example of a conventional art.
Figure 2:
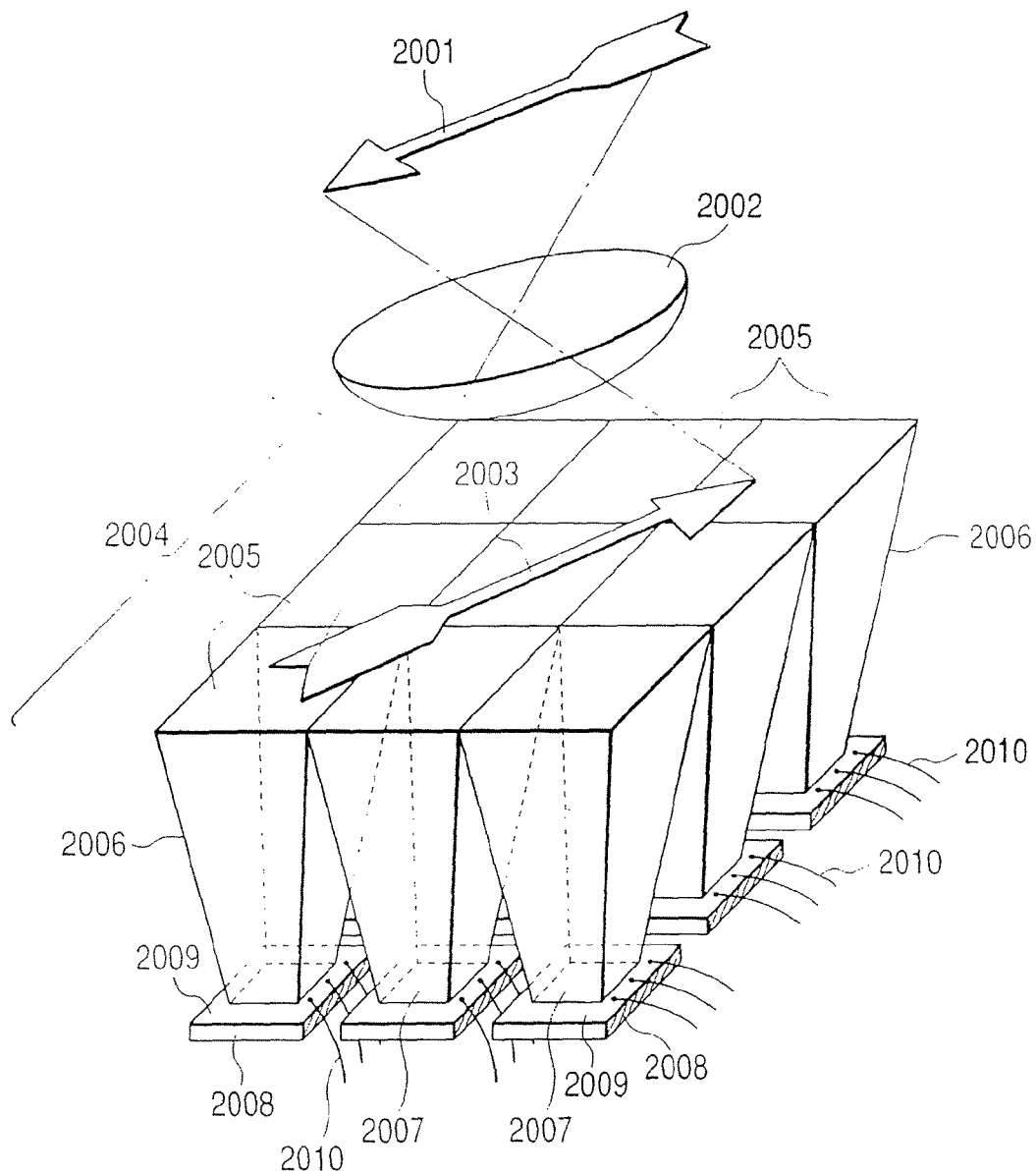
FIG. 2 illustrates an example of a conventional art.
Figure 3:
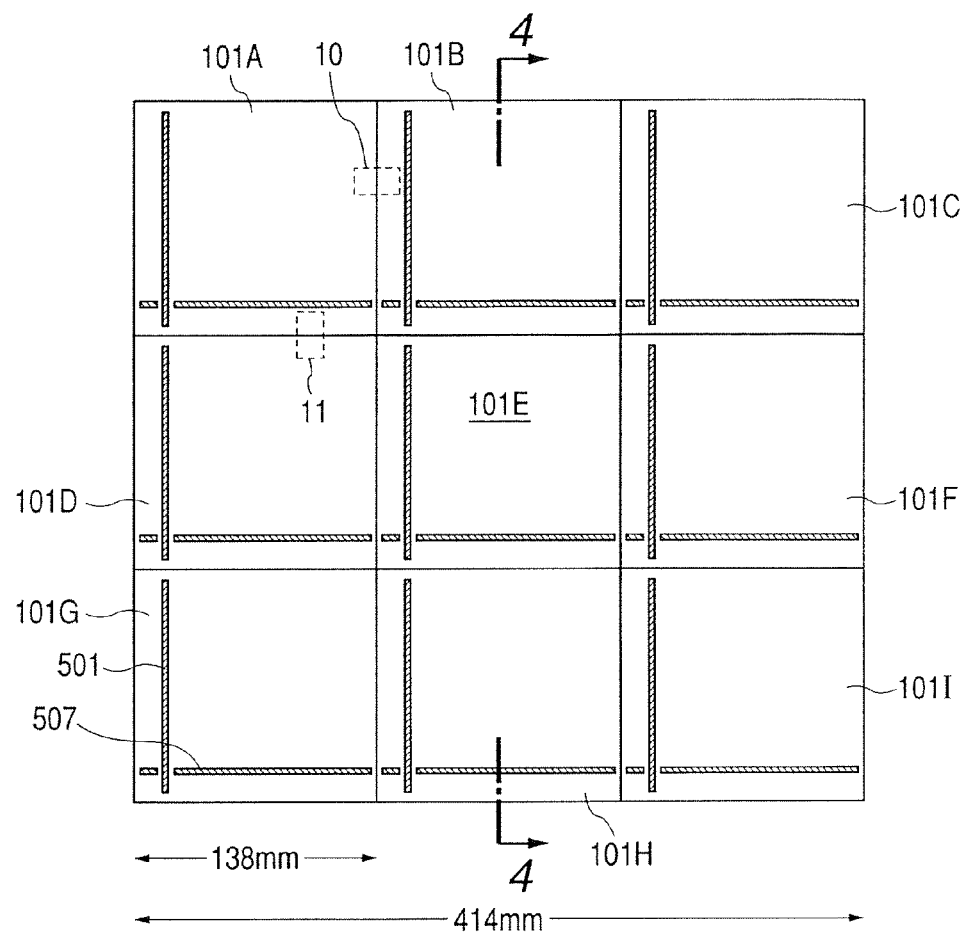
FIG. 3 is a plan view of an image sensing apparatus of first to twelfth embodiments.

FIG. 3 shows an image sensing element portion of a large area X-ray image sensing apparatus of a 414 mm square that is formed by tessellating nine image sensing elements 101A to 101I of a 138 mm square.

Figure 4:
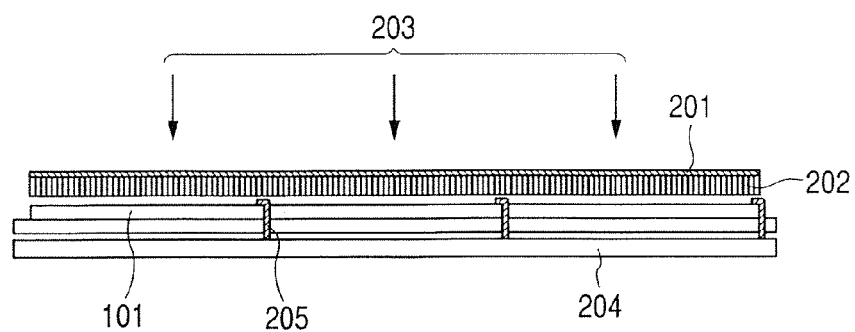
FIG. 4 is a sectional view along a line 4-4 in FIG. 3.

FIG. 4 shows a 4-4 cross section of FIG. 3. A scintillator plate 201 consisting of a scintillator such as $Gd_2O_2S$ or CsI using europium, terbium or the like as an inert body is arranged on an FOP (fiber optic plate) 202. X-ray 202 is irradiated on the scintillator and converted to visible light. This visible light is detected by the image sensing elements 101A to 101I. The scintillator is preferably selected such that its light emitting wave length conforms to the sensitivity of the image sensing elements 101A to 101I. Reference numeral 204 denotes an external processing substrate having a circuit that supplies power, clocks or the like for the image sensing elements 101A to 101I and takes out signals from the image sensing elements to process them. Reference numeral 205 denotes TABs (Tape Automated Bonding) for electrically connecting each of the image sensing elements 101A to 101I and the external processing substrate.

Clocks, power or the like of the image sensing elements 101A to 101I are inputted by and a signal from a pixel is outputted to the external processing substrate 204 arranged in the back side of the image sensing elements 101A to 101I, through the TABs 205 connected to electrode pads provided at an end of the image sensing element.

Figure 5:
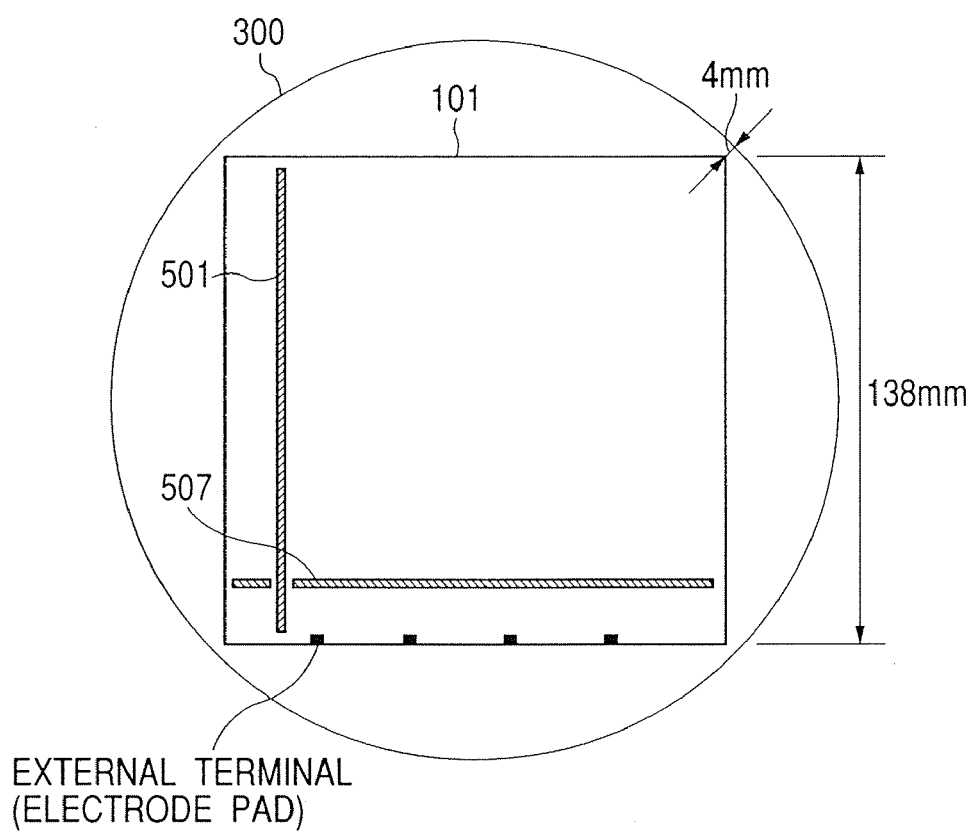
FIG. 5 is a plan view showing an image sensing element according to the first to the twelfth embodiments and a wafer forming its base.

FIG. 5 shows the case in which one image sensing element is taken out from an eight-inch wafer 300, which is currently a mainstream wafer. The eight-inch wafer 300 is an N-type wafer. Each of the CMOS type image sensing elements 101A to 101I of 138 mm square is created using this eight-inch wafer 300 by a CMOS process.

Figure 6:
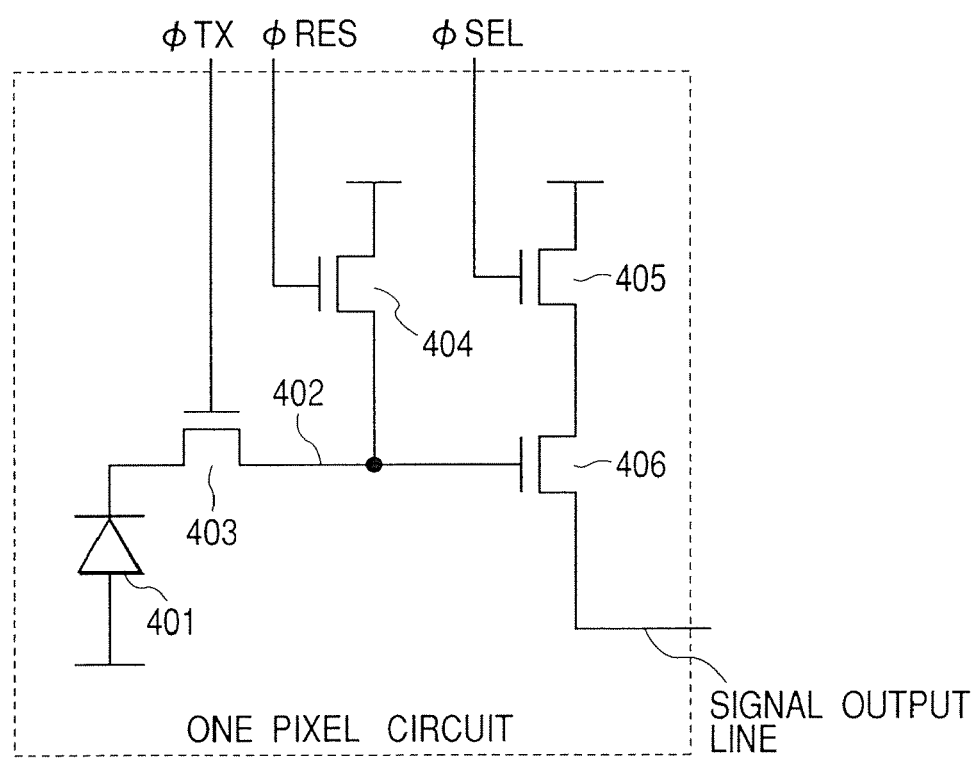
FIG. 6 is a circuit diagram of a one-pixel circuit inside the image sensing element according to the first to the twelfth embodiments according to the present invention.

FIG. 6 illustrates a configuration of a pixel part forming each pixel of the CMOS type image sensing elements 101A to 101I. Reference numeral 401 denotes a photodiode for performing photoelectric conversion (photoelectric conversion section), 402 denotes a floating diffusion for accumulating charges, 403 denotes a transfer MOS transistor (transfer switch) for transferring charges generated by the photodiode 401 to the floating diffusion 402, 404 denotes a reset MOS transistor (reset switch) for discharging the charges accumulated in the floating diffusion 402, 405 denotes a row selecting MOS transistor (row selection switch) for selecting a row, and 406 denotes an amplification MOS transistor (pixel amplifier) that functions as a source follower.

Figure 7:
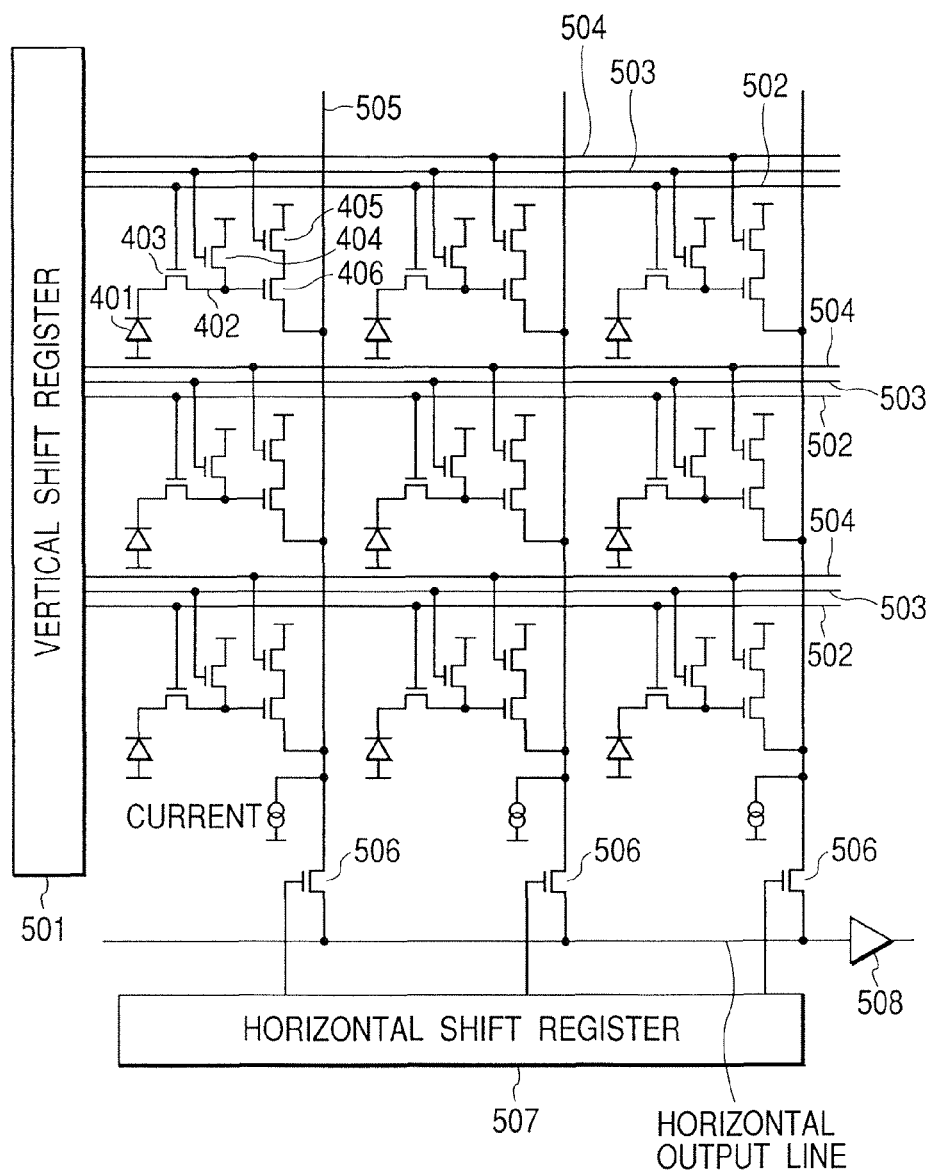
FIG. 7 is a circuit diagram of the image sensing element according to the first to the twelfth embodiments of the present invention.

FIG. 7 shows a schematic view of an entire circuit with 3×3 pixels.

A gate of the transfer switch 403 is connected to a ΦTX 502 coming from a vertical shift register being a type of a vertical scanning circuit, a gate of the reset switch 404 is connected to a ΦRES 503 coming from the vertical scanning circuit 501, and a gate of the row selection switch 405 is connected to a ΦSEL 504 coming from the vertical scanning circuit 501.

Photoelectric conversion is performed in the photodiode 401. During a period when photo-charge is accumulated, the transfer switch 403 is in the off state and the charges photoelectrically converted in this photodiode are not transferred to the gate of the source follower 406 forming a pixel amplifier. The gate of the source follower 406 forming the pixel amplifier is turned on by the reset switch 404 before starting the accumulation and initialized to an appropriate voltage. This generates a reference signal containing a noise component. When the row selection switch 405 is turned on, a source follower circuit composed of a load current source and the pixel amplifier 406 enters an operation state, and a charge at the time of reset is transferred to the gate of the sour follower 406 forming the pixel amplifier, by turning on transfer switch 403, whereby this noise signal becomes readable. Then, a noise signal output of a row selected by the row selecting MOS 405 is generated on a vertical output line (signal output line) 505 and accumulated in a not-shown storage element which is not shown. When the reset switch 404 is turned off and the row selection switch 405 is turned on next, the source follower circuit composed of the load current source and the pixel amplifier 406 enters an operation state. Then, the charges accumulated in the photodiode is transferred to the gate of the source follower 406 forming the pixel amplifier, upon turning on the transfer switch. At this point, a photodiode accumulation signal output of the row selected by the row selecting MOS 405 is generated on the vertical output line (signal output line) 505.

A noise signal is included mixedly in an accumulation signal of this photodiode. The noise signal is subtracted from the accumulation signal in a subtraction circuit (not shown) inside an image sensing element, to thereby obtain an image sensing signal.

This output is sequentially read out to an output section 508 via the horizontal output line by driving a row selection switch (multiplexer) 506 using a horizontal shift register 507 that is a type of a horizontal scanning circuit.

Items common to the first to the fifth embodiments will be hereinafter described.

Figure 8:
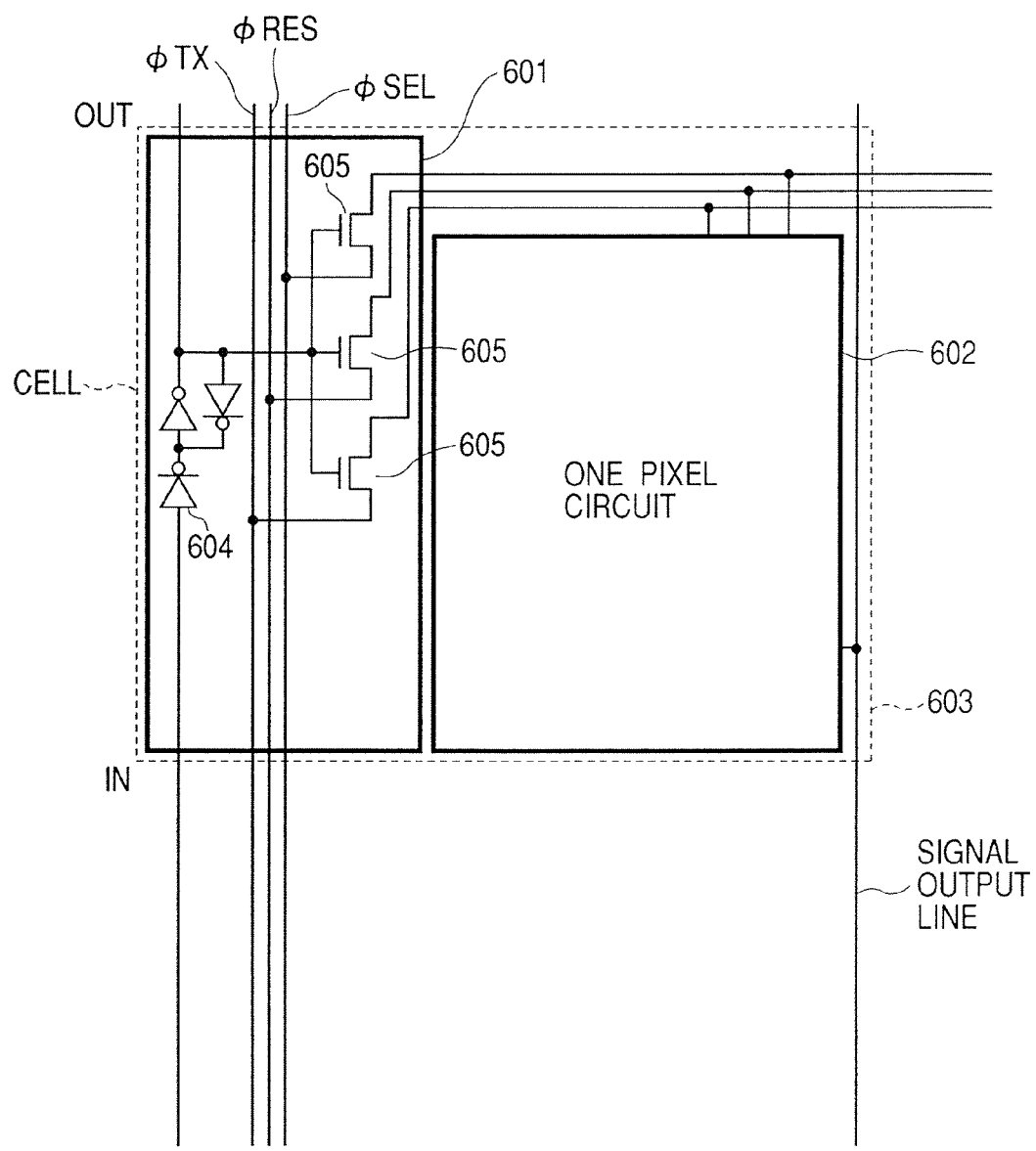
FIG. 8 is a conceptual plan view showing a configuration of a one-pixel area (cell) according to the first to the fifth embodiments of the present invention.

FIG. 8 shows an example of a unit block (a unit for selecting and driving one row) 601 of the vertical shift register 501, which is arranged on a substrate of an image sensing element. In this example, the unit block 601 of the vertical shift register 501 is arranged with a one-pixel circuit 602 in a one-pixel area (one cell) in FIG. 8. However, this embodiment is not limited to this. The one-pixel circuit 602 is as shown in FIG. 4. The vertical shift register is shown as a simple circuit that is composed of a static shift register 604 and a transfer gate 605 in order to produce a transfer signal ΦTX, a reset signal ΦRES, a row selection signal ΦSEL. These are driven by a signal from a clock signal line (not shown). A circuit configuration of a shift register is not limited to this, and an arbitrary circuit configuration can be adopted according to various methods of driving such as pixel addition or read-out with pixel.

Further, as a scanning circuit, an n to $2^n$ decoder can be used rather than a shift register. Sequential scanning becomes possible as in a shift register by connecting a counter output that sequentially increments, to an input of the decoder. On the other hand, an image of arbitrary plural-pixel areas by random scanning can be obtained by inputting an address of a plural-pixel area where an image is desired to be formed, into the input of the decoder.

Figure 9:
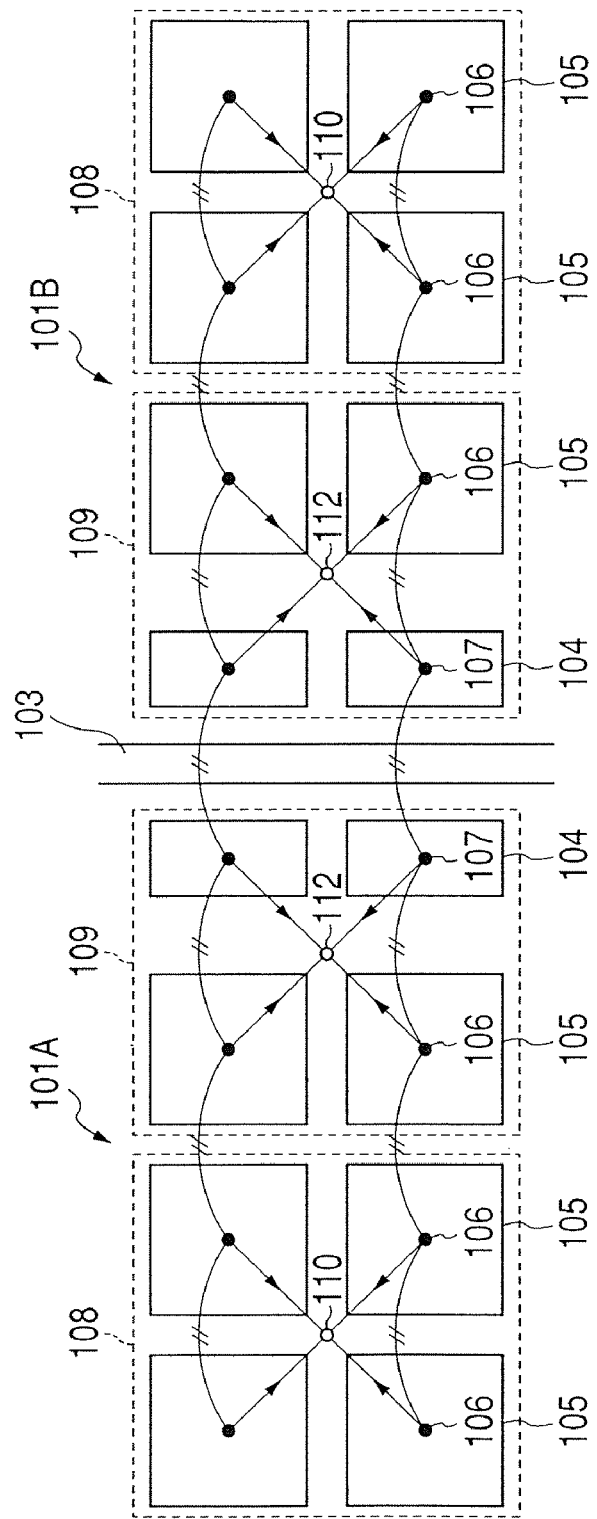
FIG. 9 is a plan view showing a method of selecting a plural-pixel area according to the first embodiment of the present invention.

FIG. 9 shows an enlarged view of a position denoted by reference numeral 10 in FIG. 3 of the image sensing apparatus according to the first embodiment.

Referring to FIG. 9, an image sensing element 101A and an image sensing element 101B are arranged adjacent to each other. The image sensing elements 101A and 101B are formed of a plurality of photoelectric converting elements, and each photoelectric converting element has a photoelectric conversion section. When the image sensing element 101A and the photoelectric element 101B are arranged side by side, a gap 103 is inevitably generated. However, by adjusting positions and widths of photoelectric conversion sections 104 of photoelectric converting elements contacting the gap 103, centroids 106 of photoelectric conversion sections 105 of (inside) photoelectric converting elements not contacting the gap 103 and centroids 107 of the photoelectric conversion sections 104 of photoelectric converting elements contacting the gap 103 are arranged at equal intervals over the image sensing elements 101A and 101B. In this way, distortion of an image can be prevented at a border of the image sensing element 101A and the image sensing element 101B.

In addition, in the case in which a one-pixel signal is obtained by collecting signals obtained from the plurality of photoelectric converting elements, distortion of an image is also prevented by performing voltage addition. That is, as shown in FIG. 9, if a pixel signal for a plural-pixel area 108 is obtained by adding voltages generated in photoelectric conversion sections of four photoelectric converting elements in the plural-pixel area 108, a position of a one-pixel signal for the plural-pixel area 108 is a position denoted by reference numeral 110 (a position coinciding with an average position of centroids of the photoelectric conversion section of the four photoelectric converting elements in the plural-pixel area 108). In addition, if a one-pixel signal for a plural-pixel area 109 is obtained by adding voltages generated in photoelectric conversion sections of four photoelectric converting elements in the plural-pixel area 109, a position of the one-pixel signal for the plural-pixel area 109 is a position denoted by reference numeral 112 (a position coinciding with an average position of centroids of the photoelectric conversion sections of the four photoelectric converting elements in the plural-pixel area 109). Therefore, the pixel centroids 110 and 112 are arranged at equal intervals.

Figure 10:
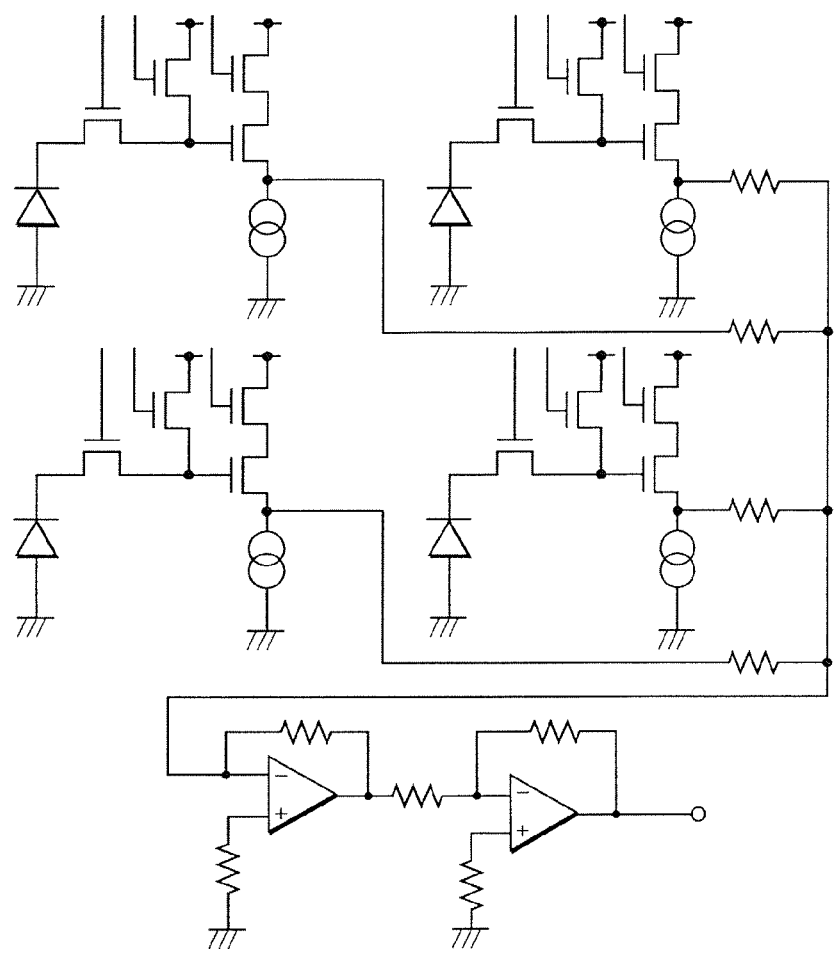
FIG. 10 is a diagram showing an example of a circuit configuration in the case in which voltages generated in four pixels are added according to an embodiment of the present invention.

FIG. 10 shows an example of a circuit configuration when voltages in four pixels are added.

Figure 11:
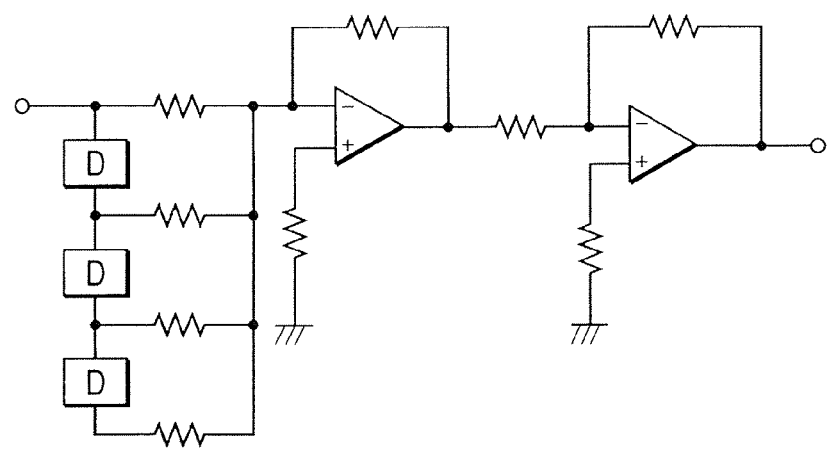
FIG. 11 is a diagram showing another example of a circuit configuration in the case in which voltages generated in four pixels are added according to the embodiment of the present invention.

In addition, the voltages of the four pixels may be added after reading a voltage generated in each pixel from an amplifier 508. When reading out a voltage on an each plural-pixel area basis, the voltages of the four pixels can be added simply by providing latches and adders for three pixels as shown in FIG. 11. In addition, if a voltage is read on an each row basis, it is sufficient to make the central latch among the latches for three pixels function as a (one row-one pixel) memory. Further, the voltages may be read in accordance with a reading address of a predetermined order and then digitally added after A/D converting an output of the amplifier 508 and writing it in a memory in accordance with a predetermined writing address. Procedures after the A/D conversion can be performed also by an information processing apparatus such as a personal computer.

A basic configuration of a second embodiment is the same as that of the first embodiment.

Figure 12:
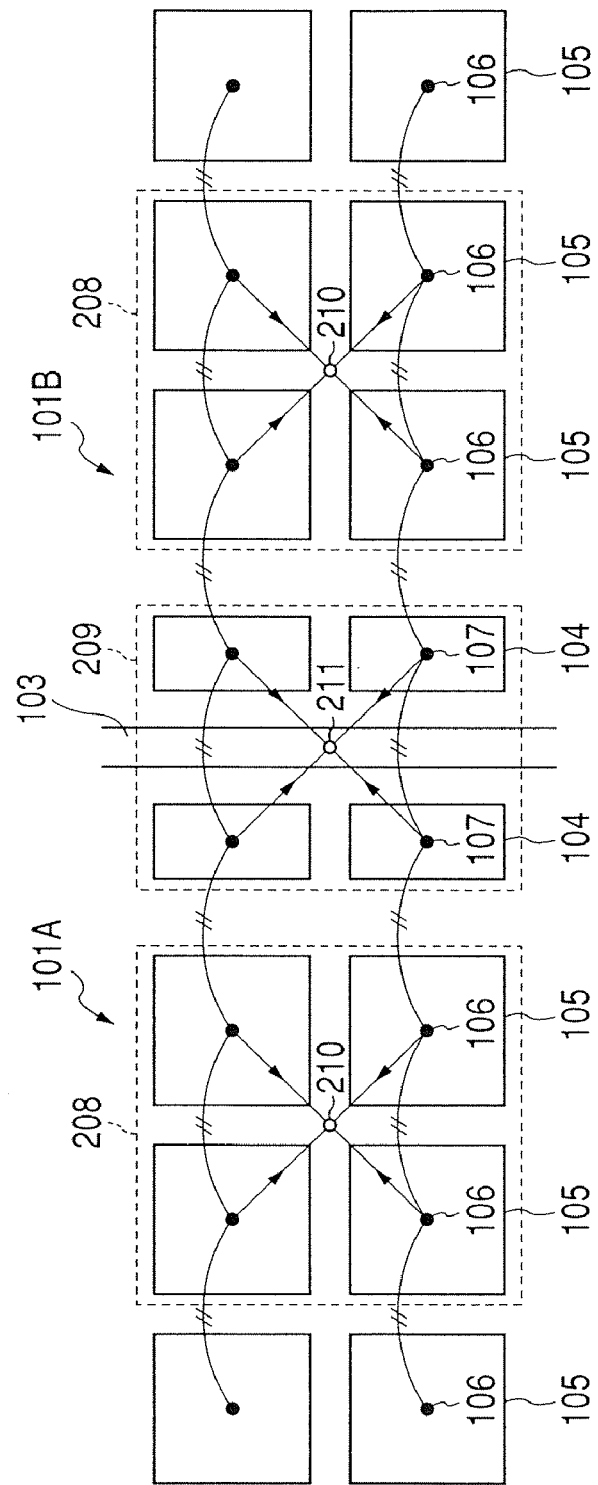
FIG. 12 is a plan view showing a method of selecting plural-pixel areas according to the second embodiment of the present invention.

FIG. 12 shows an enlarged view of the position denoted by reference numeral 10 in FIG. 3 of an image sensing apparatus according to this embodiment.

In this embodiment, plural-pixel areas for adding pixel signals are made as denoted by reference numerals 208 and 209. A position of a one-pixel signal for the plural-image area 208 is a position denoted by reference numeral 210 (a position coinciding with an average position of centroids of photoelectric conversion sections of four photoelectric converting elements in the plural-pixel area 208) both in the cases of charge addition and voltage addition. A position of a one-pixel signal for the plural-pixel area 209 is a position denoted by reference numeral 211 (a position coinciding with an average position of centroids of photoelectric conversion sections of four photoelectric converting elements in the plural-pixel area 209) both in the cases of charge addition and voltage addition.

Figure 13:
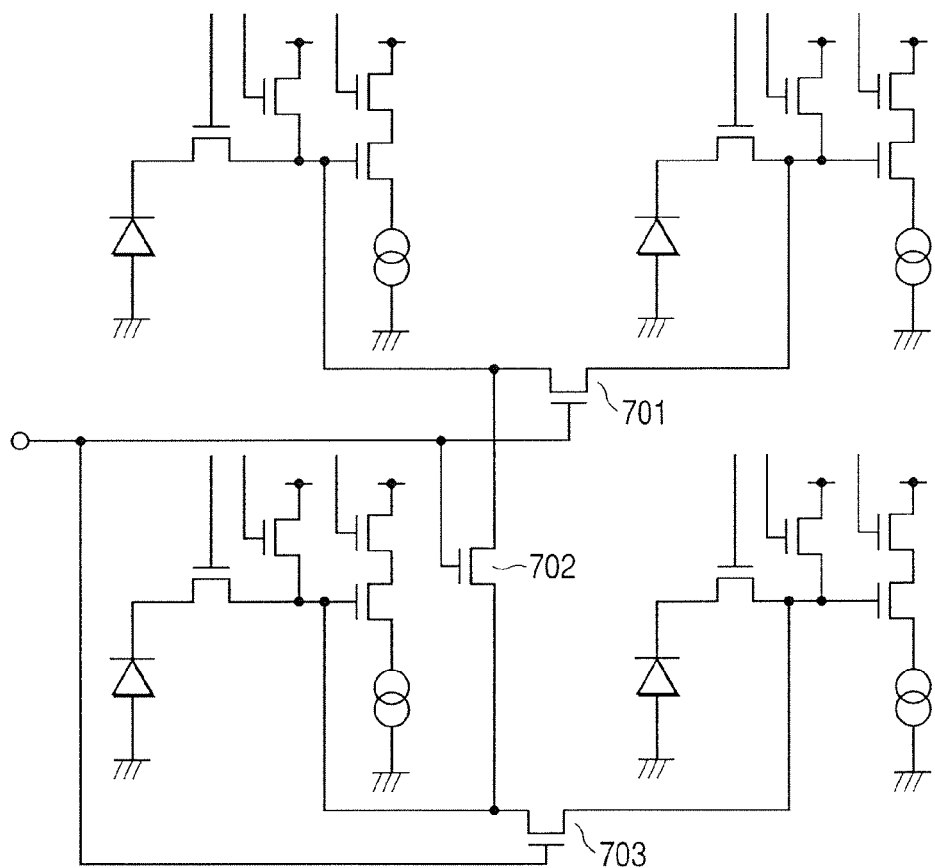
FIG. 13 is a diagram showing an example of a circuit configuration in the case in which charges generated in four pixels are added according to an embodiment of the present invention.

FIG. 13 shows a view of a circuit configuration for adding charges generated in four pixels. In this circuit configuration, after transferring charges accumulated in a photodiode to a floating diffusion by turning on a transfer switch, the charges are averaged among the four pixels by turning on switches 701, 702 and 703, and thereafter a row selection switch is turned on. Thus, pixel centroids 210 and 211 for each plural-pixel area are arranged at equal intervals regardless of whether pixel signals are added by the charge addition or are added by the voltage addition.

A basic configuration of a third embodiment is the same as that of the first embodiment.

Figure 14:
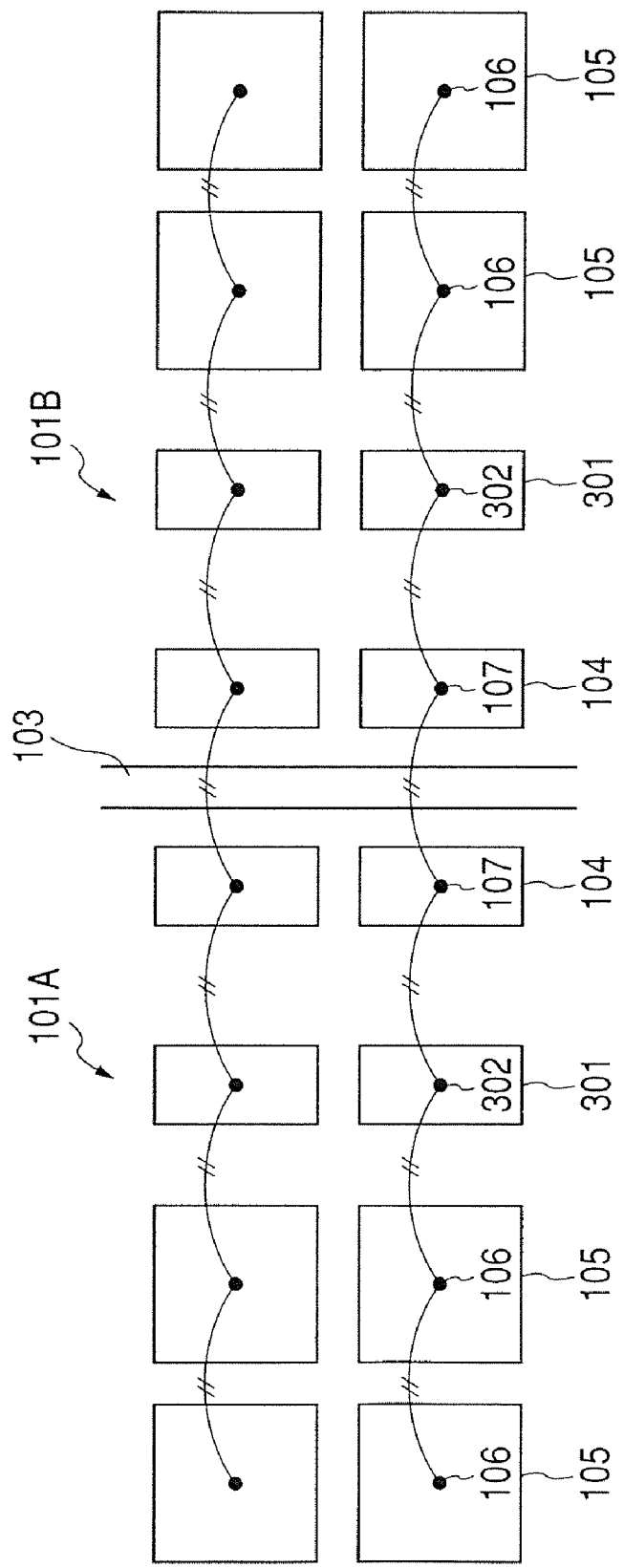
FIG. 14 is a plan view showing a layout of a photoelectric conversion section according to the third embodiment of the present invention.

FIG. 14 shows an enlarged view of the position denoted by reference numeral 10 in FIG. 3 of the image sensing apparatus according to this embodiment.

In the example of FIG. 14, not only the position and the width of the photoelectric conversion sections 104 of the photoelectric converting elements adjacent to the gap 103 but also the position and the width of photoelectric conversion sections 301 of photoelectric converting elements adjacent to the photoelectric converting elements that are adjacent to the gap 103 are adjusted. The width of the photoelectric conversion sections 301 is made equal to the width of the photoelectric conversion sections 104, whereby the area of the photoelectric conversion sections 104 and the area of the photoelectric conversion sections 301 are made equal in this example. However, the area of the photoelectric conversion sections 104 and the area of the photoelectric conversion sections 301 may be made equal by adjusting a relative height of the photoelectric conversion sections 301 with respect to the height of the photoelectric conversion sections 104 or by adjusting a relative width and height of the photoelectric conversion sections 301 with respect to the width and the height of the photoelectric conversion sections 104. That is, as long as the area of the photoelectric conversion sections 301 is made equal to the area of the photoelectric conversion sections 104, an adjusting part of dimensions does not matter.

In addition, the positions of the photoelectric conversion sections 104 and the positions of the photoelectric conversion section 301 are adjusted such that centroid positions 107 of the photoelectric conversion sections 104, centroid positions 302 of the photoelectric conversion sections 301 and centroid positions 106 of the photoelectric conversion sections 105 are arranged at equal intervals.

That is, in this embodiment, the positions and the size of the photoelectric conversion sections 104 and the positions and the size of the photoelectric conversion sections 301 are adjusted such that the centroid positions 106, 107 and 302 are arranged at equal intervals and the area of the photoelectric conversion sections 104 and the area of the photoelectric conversion sections 301 are made equal.

Figure 15:
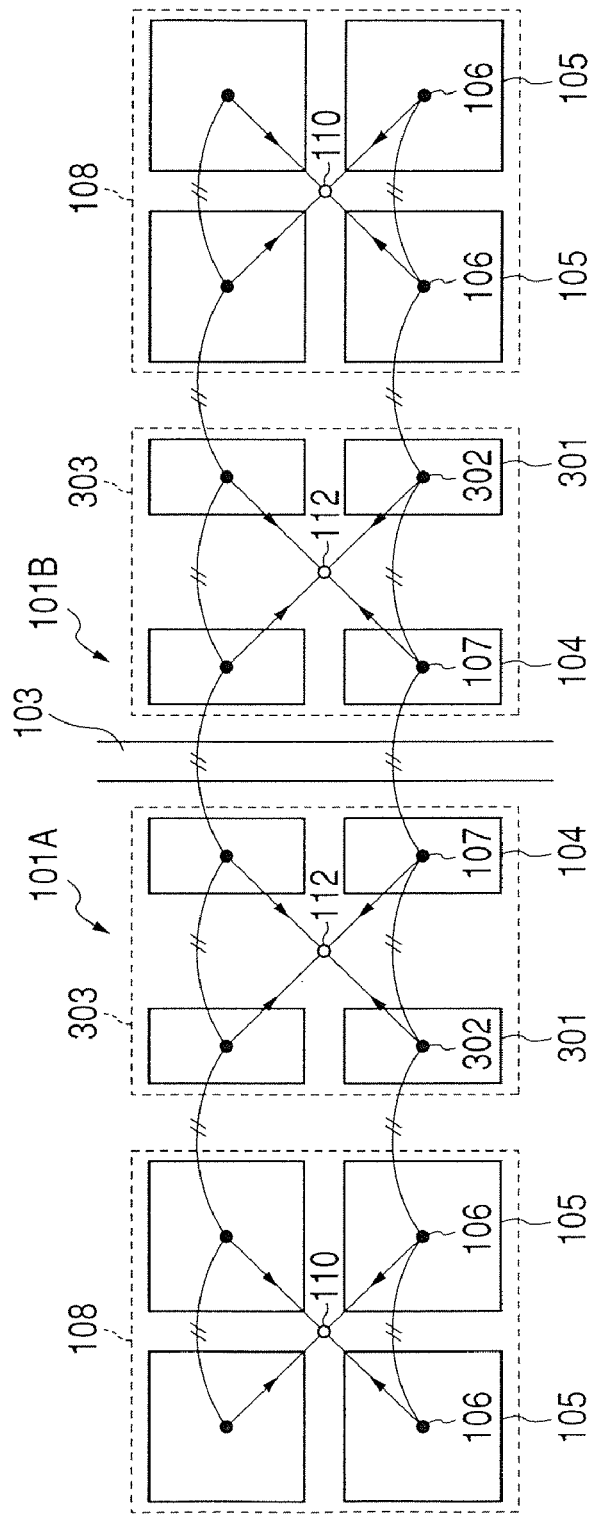
FIG. 15 is a plan view showing a method of selecting plural-pixel areas according to the third embodiment of the present invention.

In addition, in the case in which signals obtained from a plurality of photoelectric converting elements are collected to obtain a one-pixel signal, a one-pixel signal for the plural-pixel area 108 and a one-pixel signal for the plural-pixel area 303 are obtained as shown in FIG. 15. The plural-pixel area 303 is a plural-pixel area consisting of two photoelectric converting elements adjacent to the gap 103 and two photoelectric converting elements adjacent to the two photoelectric converting elements that are adjacent to the gap. By setting the plural-pixel area in this way, the position 110 of the one-pixel signal for the plural-pixel area 108 and the position 112 of the one-pixel signal for the plural-pixel area 303 are arranged at equal intervals both in the cases of the charge addition and the voltage addition.

Figure 16:
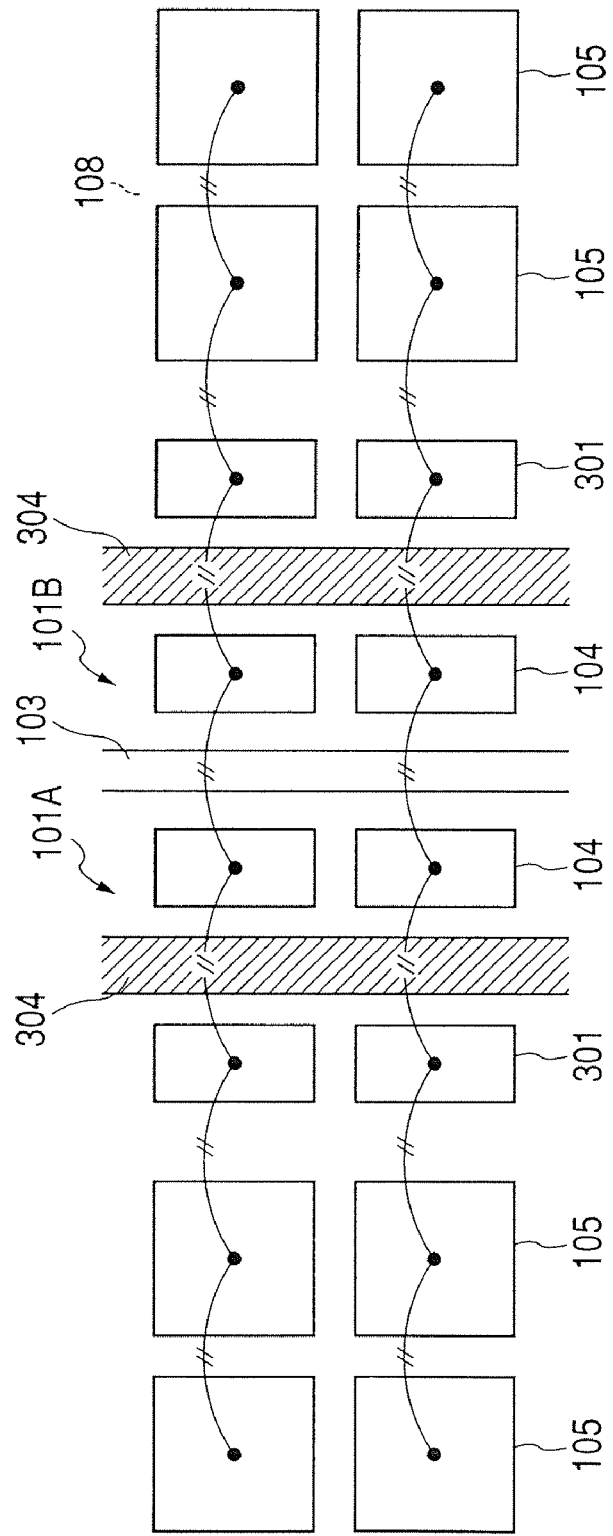
FIG. 16 is a plan view showing layouts of photoelectric conversion sections and scanning circuits according to the fourth embodiment of the present invention.

A fourth embodiment is a configuration in which scanning circuits 304 are arranged between the photoelectric conversion sections 301 and the photoelectric conversion sections 104 in the configuration of the third embodiment as shown in FIG. 16. Although the scanning circuit 304 is a vertical-scanning circuit in the plural-pixel area 10 (FIG. 3), it is a horizontal scanning circuit in the plural-pixel area 11 (FIG. 3).

According to this embodiment, scanning circuits are arranged in spaces between the narrowed photoelectric conversion sections 301 and photoelectric conversion sections 104, whereby the scanning circuits can be arranged in the image sensing element without breaking the condition that the pixel centroids are arranged at equal intervals, irrespective of whether a one-pixel signal is obtained from each photoelectric converting element or one-pixel signals are obtained from a plurality of photoelectric elements.

Figure 17:
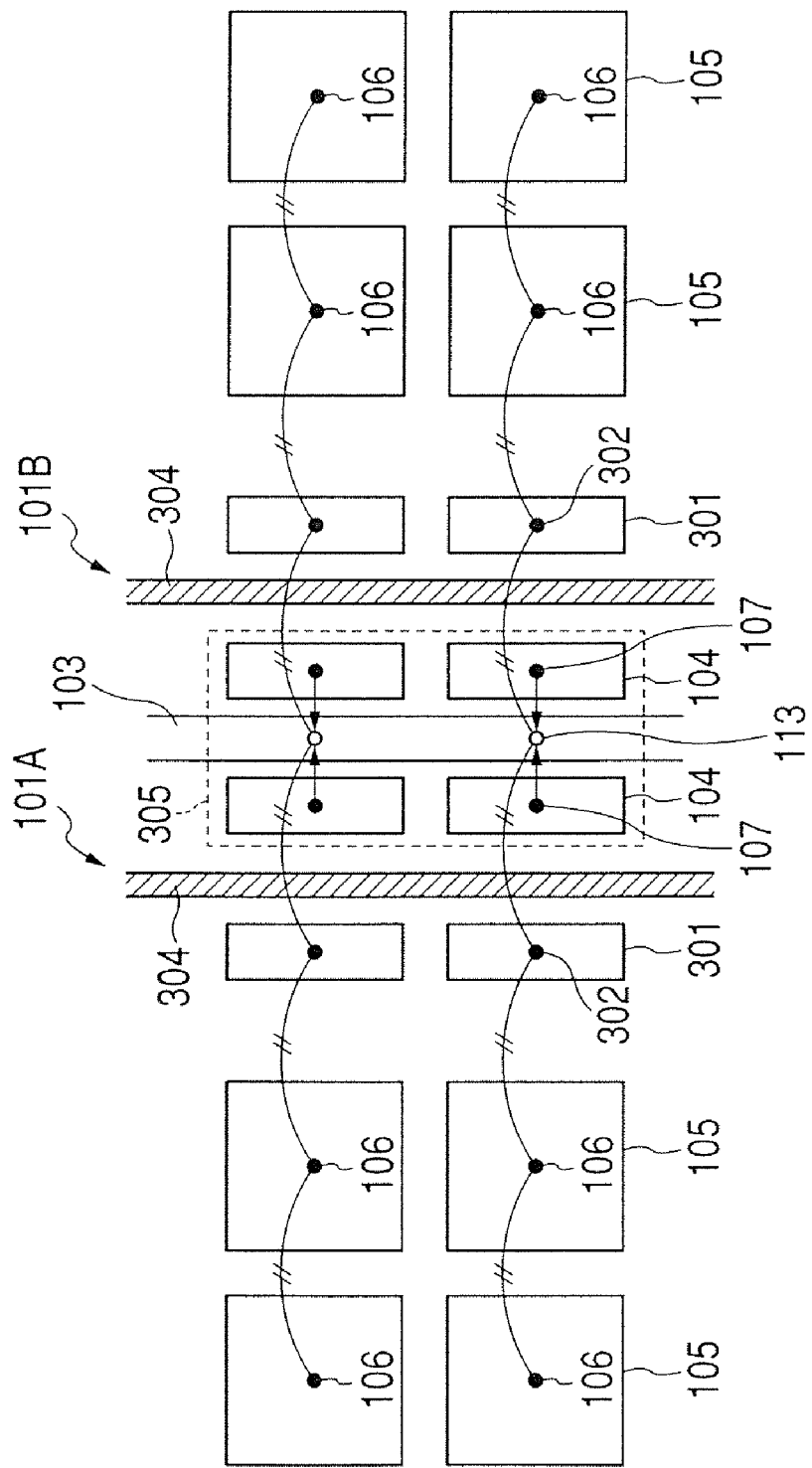
FIG. 17 is a plan view showing layouts of photoelectric conversion sections and scanning circuits according to the fifth embodiment of the present invention.

A fifth embodiment is a configuration in which scanning circuits 304 are arranged between the photoelectric conversion sections 301 and the photoelectric conversion sections 104 in the configuration of the third embodiment as shown in FIG. 17. Although the scanning circuit 304 is a vertical scanning circuit in the plural-pixel area 10 (FIG. 3), it is a horizontal scanning circuit in the plural-pixel area 11 (FIG. 3).

According to this embodiment, scanning circuits are arranged in spaces between the narrowed photoelectric conversion sections 301 and photoelectric conversion sections 104, whereby the scanning circuits can be arranged in the image sensing element without breaking the condition that the pixel centroids are arranged at equal intervals, irrespective of whether a pixel signal is obtained from each photoelectric converting element or one-pixel signals are obtained from a plurality of photoelectric elements. In addition, pixels 104 opposing adjacent to each other are added in the gap between the image sensing elements 101A and 101B, whereby the distance between added pixel centroids 113 and the one-pixel centroid 302 of the other photoelectric converting element and the distance between the one-pixel centroids 302 and 106 can be made to coincide with each other.

A basic configuration of the fifth embodiment is as described below.

FIG. 16 shows an enlarged view of the position denoted by reference numeral 10 in FIG. 3 of the image sensing apparatus according to this embodiment.

In the example of FIG. 16, not only the position and the width of the photoelectric conversion sections 104 of the photoelectric converting elements adjacent to the gap 103 but also the position and the width of photoelectric conversion sections 301 of photoelectric converting elements adjacent to the photoelectric converting elements that are adjacent to the gap 103 are adjusted. The added centroids 113 of the photoelectric converting elements 104 and the centroids 302 and 106 of the other photoelectric converting elements are arranged at equal intervals by adjusting the relative positions of the photoelectric conversion sections 301 with respect to the photoelectric conversion sections 104.

In addition, the positions of the photoelectric conversion sections 104 and the positions of the photoelectric conversion section 301 are adjusted such that added centroid positions 107 of the photoelectric conversion sections 104, centroid positions 302 of the photoelectric conversion sections 301 and centroid positions 106 of the photoelectric conversion sections 105 are arranged at equal intervals.

That is, in this embodiment, the positions and the size of the photoelectric conversion sections 104 and the positions and the size of the photoelectric conversion sections 301 are adjusted such that the added centroid positions 113 of the pixels opposing each other through the gap, the centroids 302 of the adjacent photoelectric converting elements and the centroids 106 of the other photoelectric converting elements are arranged at equal intervals.

By setting the plural-pixel area 305 in the lamination gap section in this way, the position 113 of the one-pixel signal for the plural-pixel area 305 and the centroid positions 302 and 106 for the one-pixels 301 and 105, respectively, are arranged at equal intervals both in the cases of the charge addition and the voltage addition, whereby distortion of an image is eliminated. In addition, since signals of a plurality of photoelectric conversion sections of a plural-pixel area are added, influence of offset for each image sensing element is also reduced.

As described above, in this embodiment, processing is performed such that a one-pixel signal is obtained by adding signals of a plurality of photoelectric conversion sections within a plural-pixel area, a one-pixel signal is obtained from each photoelectric conversion section in the other areas, and an image is obtained by an image processing circuit (not shown) using the one-pixel signal obtained by addition and the one-pixel signal from each photoelectric section.

In the above-mentioned first to fifth embodiments, the examples of adding signals in the state of analog signals are shown as an adding circuit. However, signals may be added after being converted to digital signals by an analog/digital converting circuit.

As described above, according to the first to the fifth embodiments, pixel signals arranged at equal intervals can be obtained in a border between image sensing elements not only in the case in which a one-pixel signal is obtained from each photoelectric converting element but also in the case in which one-pixel signals are obtained from a plurality of photoelectric converting elements in an image sensing apparatus that is configured by tessellating a plurality of image sensing elements. Thus, an image obtained from the image sensing apparatus is never distorted even in borders between the image sensing elements.

In the arrangements shown in FIGS. 9, 12, 14, 15, 16 and 17, the photoelectric conversion sections other than those 104, 105 and 301 are light-shielded with a light shielding member (not shown) which is formed with a metal layer such as aluminum layer or the like. In this case, a photoelectric conversion section corresponds to an opening portion of the light shielding member. In the circuits shown in FIGS. 6, 7, 8, 10 and 13, an addition circuit, a transfer switch, a reset switch, a pixel amplifier and the like other than the photoelectric conversion section (a photodiode) are arranged under a light shielding member, thereby being shielded from light. In addition, the scanning circuit 304 and common processing circuit shown in FIGS. 16 and 17 are also arranged under a light shielding member, thereby being shielded from light.

Figure 18:
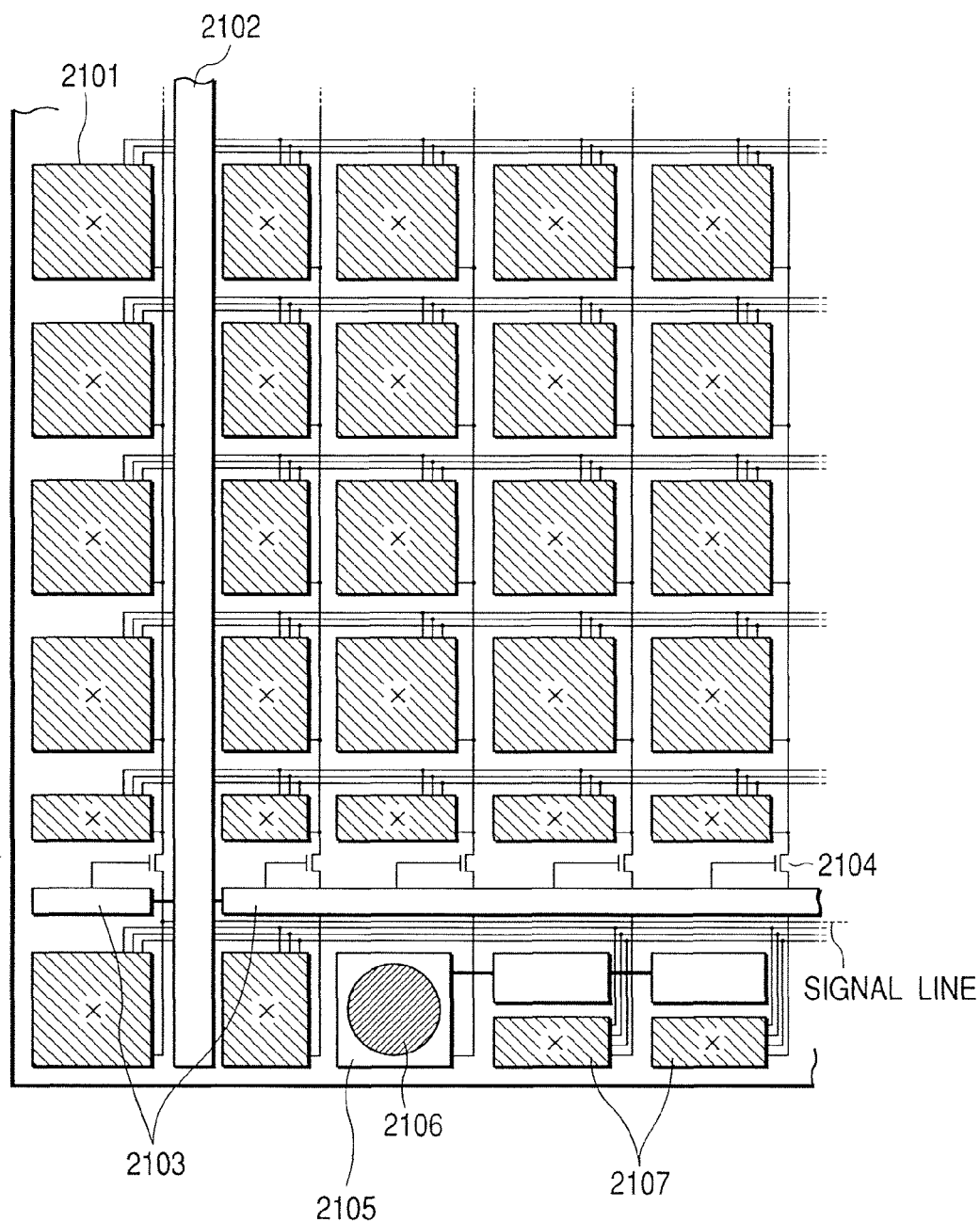
FIG. 18 is a plan view showing a layout of image sensing elements proposed by the applicant.

FIG. 18 will now be described before describing sixth to twelfth embodiments.

The applicant has proposed an image sensing apparatus having an image sensing element as shown in FIG. 18 for the purpose of providing a seamless image using a high-performance image sensing element of a plurality of monocrystal silicon.

Referring to FIG. 18, reference numeral 2101 denotes a photoelectric conversion section (photodiode) of each of a plurality of photoelectric converting elements provided in an image sensing element, 2102 denotes a vertical shift register that is a type of a vertical scanning circuit, 2103 denotes a horizontal shift register that is a type of a horizontal scanning circuit, 2104 denotes a switch forming a multiplexer for alternately supplying a signal read out on a vertical reading line to a horizontal reading line, 2105 denotes an external terminal (having a bump 2106) for supplying power and signal from the outside or supplying a signal to the outside, and 2107 denotes a protective circuit for protecting an image sensing element from a high voltage and a high current from the outside.

In FIG. 18, centroids of the photoelectric conversion sections shown by "x" are not arranged at equal intervals. This is because the centroids of the photoelectric conversion sections, the left sides of which are eroded by the vertical shift register 2102, are moved to the right, centroids of the photoelectric conversion sections, the lower sides of which are eroded by the switch 2104, are moved upward, and centroids of the photoelectric conversion section, the upper side of which are eroded by the protective circuit 2107, are moved downward.

Thus, in view of the above-mentioned points, an image sensing apparatus, in which centroids of photoelectric conversion sections are arranged at equal intervals even if a scanning circuit is arranged in an image sensing area that is an effective pixel area of an image sensing element, will be described in the following embodiments.

Figure 19:
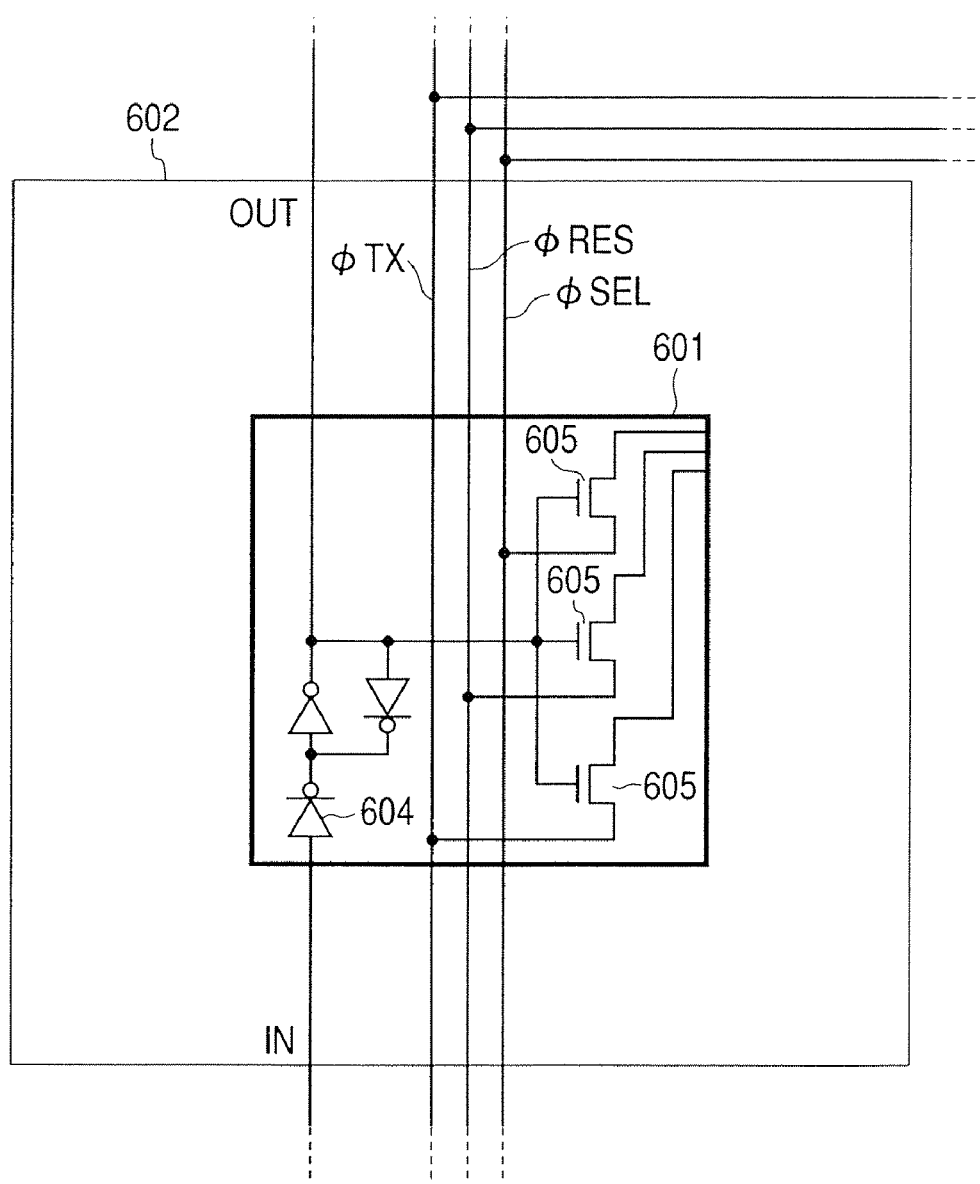
FIG. 19 is a conceptual plan view showing a configuration of a one-pixel area (cell) according to the sixth to the twelfth embodiments of the present invention, which shows how elements of a scanning circuit are arranged inside a photoelectric conversion section.

FIG. 19 shows a situation in which the unit block (unit for selecting and driving one row) 601 of the vertical shift register 501 is arranged inside a photoelectric conversion section 602 of a one-pixel area (one cell). The vertical shift register is structured as a circuit that is composed of the static-type shift register 604 and the transfer gate 605 in order to produce a transfer signal ΦTX, a reset signal ΦRES and a row selection signal ΦSEL. These are driven by a signal from a clock signal line (not shown). A circuit configuration of a shift register is not limited to this, and an arbitrary circuit configuration may be adopted according to various methods of driving such as pixel addition and read-out with thinning out.

In the following embodiments, a common processing circuit means a circuit such as a final signal output amplifier, a serial/parallel converting multiplexer, an amplifier or various gate circuits, which collectively processes a plurality of pixels in common. The common processing circuit is functionally a circuit for outputting an image signal of each pixel read out on a vertical reading line to the outside through a horizontal reading line and an amplifier.

On the other hand, an individual circuit means a circuit such as a photodiode, a transfer switch, a pixel selection switch or a pixel output amplification circuit, which processes one pixel only.

Figure 20:
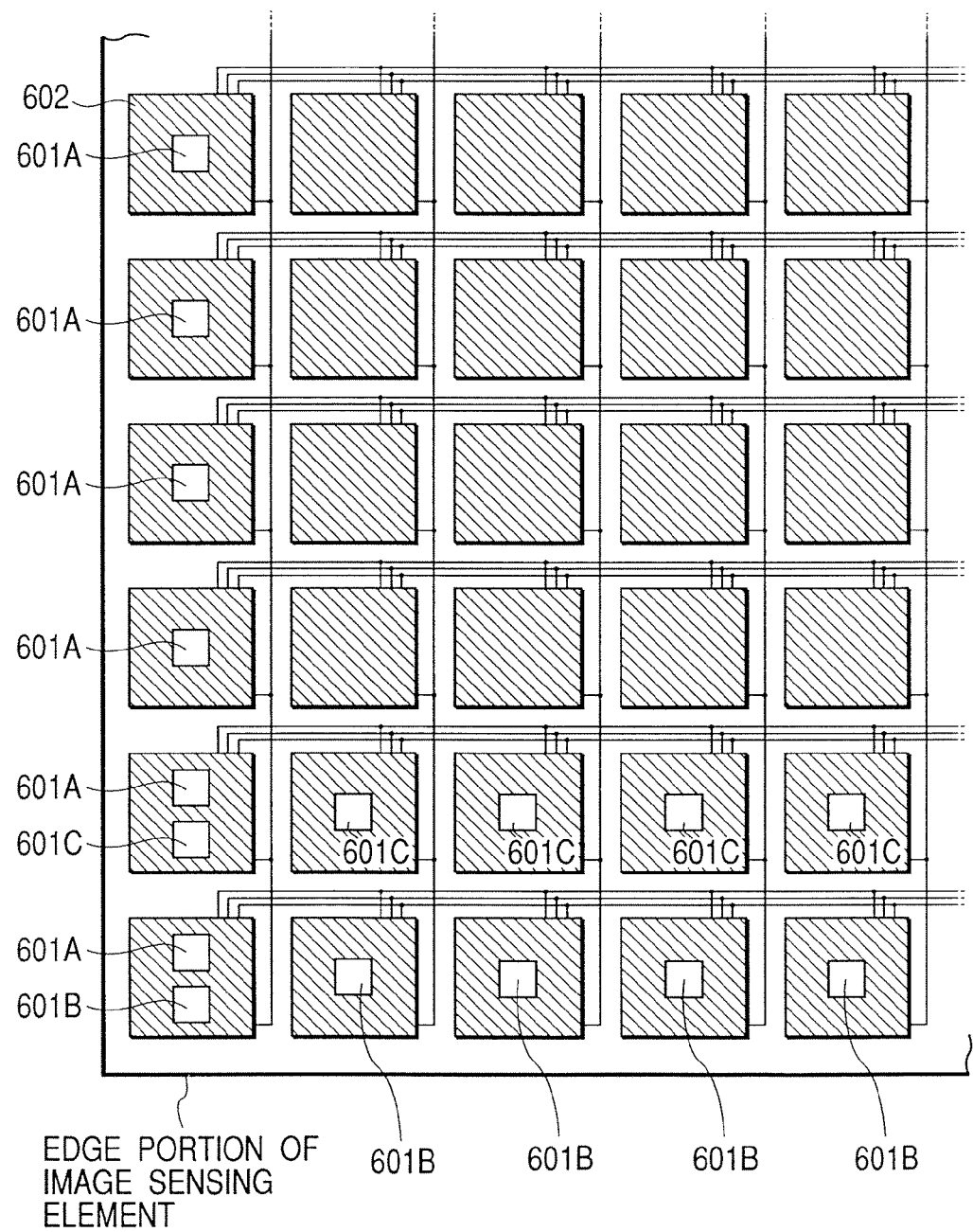
FIG. 20 is a plan view showing a layout of the image sensing elements according to the first embodiment of the present invention.

FIG. 20 shows a configuration (plan view) of an image sensing element of the sixth embodiment.

In this embodiment, a vertical shift register 501B, a horizontal shift register 507B and a common processing circuit (including a multiplexer) are arranged in an effective pixel area of the image sensing element.

Reference numeral 601A denotes circuits for one row among vertical scanning circuits, 601B denotes circuits (unit blocks) for one column among horizontal scanning circuits, and 601C denotes circuits (unit blocks) for one column among common processing circuits. The centroid of the photoelectric section 602 in which the circuit 601A is arranged in the center is identical with the centroid of the photoelectric conversion section 602 in which the circuit 601A is not arranged. Similarly, the centroid of the photoelectric conversion section 602 in which the circuit 601B is arranged in the center is identical with the centroid of the photoelectric conversion section 602 in which the circuit 601B is not arranged. The centroid of the photoelectric conversion section 602 in which the circuit 601C is arranged in the center is identical with the centroid of the photoelectric conversion section 602 in which the circuit 601C is not arranged. Moreover, the centroid of the photoelectric conversion section 602 in which the circuit 601A and the circuit 601B are arranged symmetrically with respect to the central line of the photoelectric conversion section 602 is identical with centroid of the photoelectric conversion section 602 in which the circuit 601A and the circuit 601B are not arranged. Similarly, the centroid of the photoelectric conversion section 602 in which the circuit 601A and the circuit 601C are arranged symmetrically with respect to the central line of the photoelectric conversion section 602 is identical with centroid of the photoelectric conversion section 602 in which the circuit 601A and the circuit 601C are not arranged. On the other hand, when the circuits 601A, 601B and 601C are not arranged, the centroids of the photoelectric conversion sections 602 are arranged at equal intervals. Therefore, the centroids of the photoelectric conversion sections 602 are arranged at equal intervals even if the circuits 601A, 601B and 601C are arranged.

Further, a static-type shift register is used as a shift register being an example of a scanning circuit. Various circuit configurations can be applied to the shift register by designing. In this embodiment, a general example of a circuit is described. What is important is the point that the static shift register is used.

In this embodiment, since a shift register is arranged in an effective pixel area, X-ray having penetrated a scintillator plate is directly irradiated on the shift register. X-ray is problematic because it damages an element or causes an error.

As an example of an error, there is a phenomenon in which charges are accumulated on an interface between an insulating oxide film $SiO_2$ and silicon and variation of a threshold value or increase of a leak current is caused. In addition, as an example of a damage, there is a defect generated on a pn junction surface, which causes increase of a leak current.

As another example of an error, there is an error similar to an error (soft error) due to an action of a hot electron known as a failure in an MOS type dynamic RAM.

Although a hot electron generated by an electric field tends to be generated in a short channel structure in which an electric field is high, a hot electron generated by X-ray is generated regardless of its size. Thus, an image sensing apparatus tends to be unstable when X-ray is irradiated on it regardless of its plane size.

A shift register used for driving pixels of an image sensing element will now be described. A shift register circuit is used for sequentially transferring pulse signals.

Figure 21:
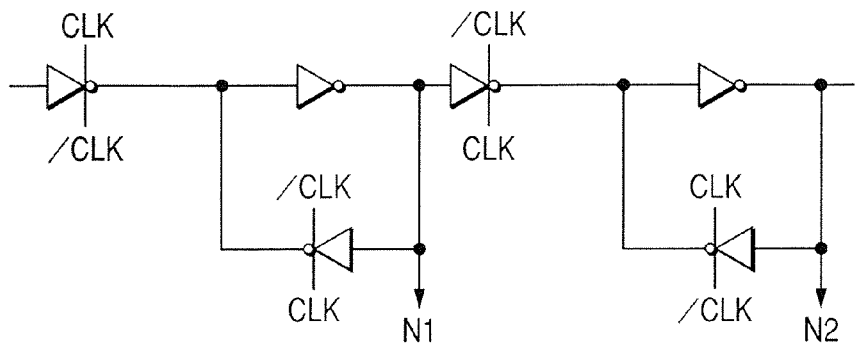
FIG. 21 is a circuit diagram showing a first example of a static-type shift register.
Figure 22:
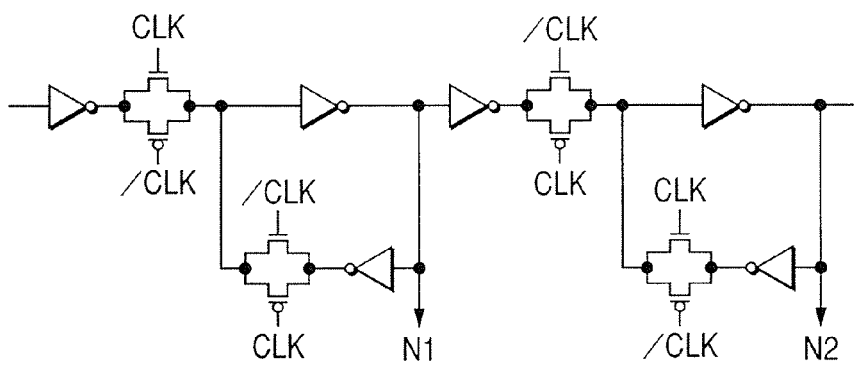
FIG. 22 is a circuit diagram showing a second example of the static-type shift register.

FIGS. 21 and 22 show examples of a configuration of a static shift register circuit. This shift register circuit is disclosed in Japanese Patent Application Laid-open No. 9-223948. A first stage section of the shift register circuit consists of one inverter and two clocked inverters in the configuration of FIG. 21 and consists of three inverters and two CMOS transfer gates in the configuration of FIG. 22. Here, clock signals CLK and /CLK ("/" indicates a negative logic) having opposite phases are inputted in each of the two clocked inverters or each of the two CMOS transfer gates. In addition, clock signals having opposite phases are inputted in each of adjacent shift register circuits.

Figure 23:
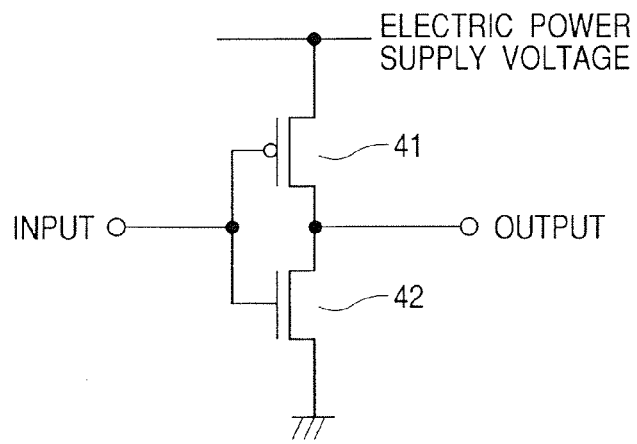
FIG. 23 is a circuit diagram showing an example of an invertor used for the shift register.

FIG. 23 shows a view of an internal configuration of an inverter.

Figure 24:
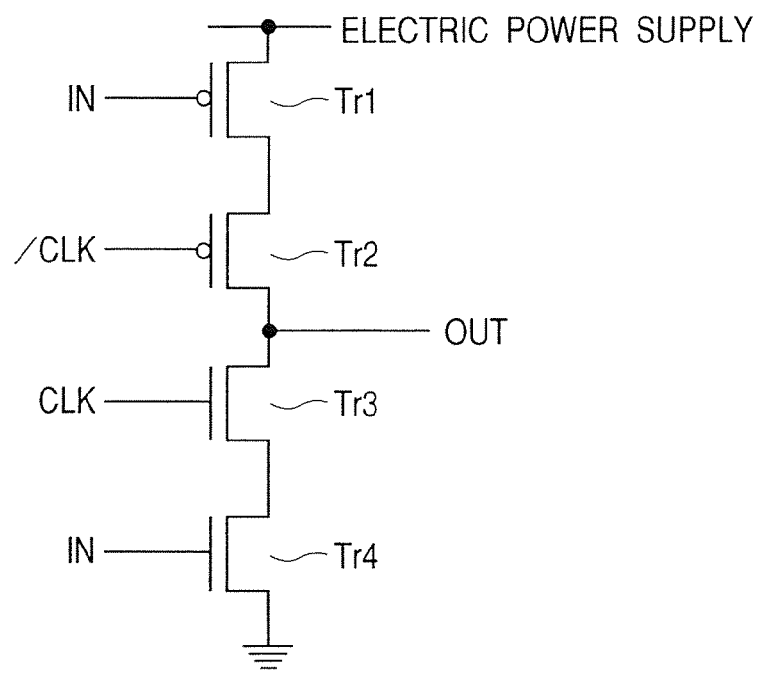
FIG. 24 is a circuit diagram showing an example of a clocked invertor used in the static-type shift register.

FIG. 24 shows a view of an internal configuration of a clocked inverter. The clocked inverter is composed of a p channel type input transistor Tr1, a p channel type clocked transistor Tr2, an n channel type clocked transistor Tr3 and an n channel type input transistor Tr4, which are serially connected between a power supply and a ground. An output is taken out from a connecting point of the transistor Tr2 and the transistor Tr3.

As described above, the shift register circuit used in a driving circuit is usually driven in synchronous with a clock by two clock signals having opposite phases.

Figure 25:
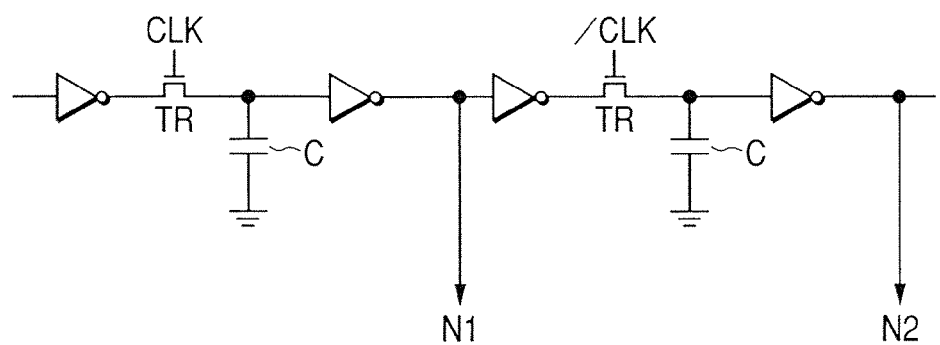
FIG. 25 is a circuit diagram showing an example of a dynamic-type shift register.

FIG. 25 shows an example of a configuration of a dynamic-type shift register circuit. Whereas a clocked inverter (or a transfer gate and an inverter) for feedback is provided in the static-type shift register, a transistor TR in which clocks are applied by a gate, and a capacitor C, are provided between inverters in the dynamic-type shift register, whereby the number of elements is reduced to realize low power consumption. This shift circuit is disclosed in Japanese Patent Application Laid-open No. 5-218814. The dynamic-type shift register theoretically performs operations for accumulating charges in the capacitor to hold data.

In the dynamic-type shift register, if leakage exists in an interface between a pn junction surface or an insulating layer and silicon, the capacitor cannot hold charges and the dynamic-type shift register does not operate normally. When the dynamic-type shift register is used in a place where X-ray is irradiated, it is susceptible to damages by the X-ray and does not operate due to increase of a leak current, whereby a problem concerning reliability arises. In addition, a normal image cannot be obtained because of a failure due to a hot electron caused by X-ray.

In contrast, theoretically, the static-type shift register is relatively insusceptible to an influence of X-ray, thus it can be used in a place where X-ray is directly irradiated as in this embodiment. Therefore, if the static-type shift register is used, an image sensing apparatus with fewer damages or errors caused by X-ray and improved reliability can be realized.

In addition, as a scanning circuit, an n to $2^n$ decoder can be used rather than a shift register. Sequential scanning becomes possible as in a shift register by connecting a counter output that sequentially increments, to an input of the decoder. On the other hand, an image of an arbitrary area by random scanning can be obtained by inputting an address of an area where an image is desired to be formed, into the input of the decoder.

The above-mentioned configuration of the shift register is applied to the above-mentioned first to fifth embodiments and the seventh to the twelfth embodiments to be described later.

This embodiment uses a CMOS sensor as an image sensing element, it is preferred in forming a large image sensing apparatus that consumes less power.

Further, it is for the purpose of accelerating operations of an image sensing element to provide a multiplexer in the image sensing element.

In addition, a signal is taken out to the outside from an image sensing element through an electrode pad, around which there is a large floating capacity. Therefore, a transmission property of a signal can be compensated by providing the amplifier 508 in the front stage of the electrode pad.

An image sensing apparatus of the seventh embodiment is the same as the sixth embodiment in a basic configuration and is different from the sixth embodiment in a format of arranging a scanning circuit and a common processing circuit.

Figure 26:
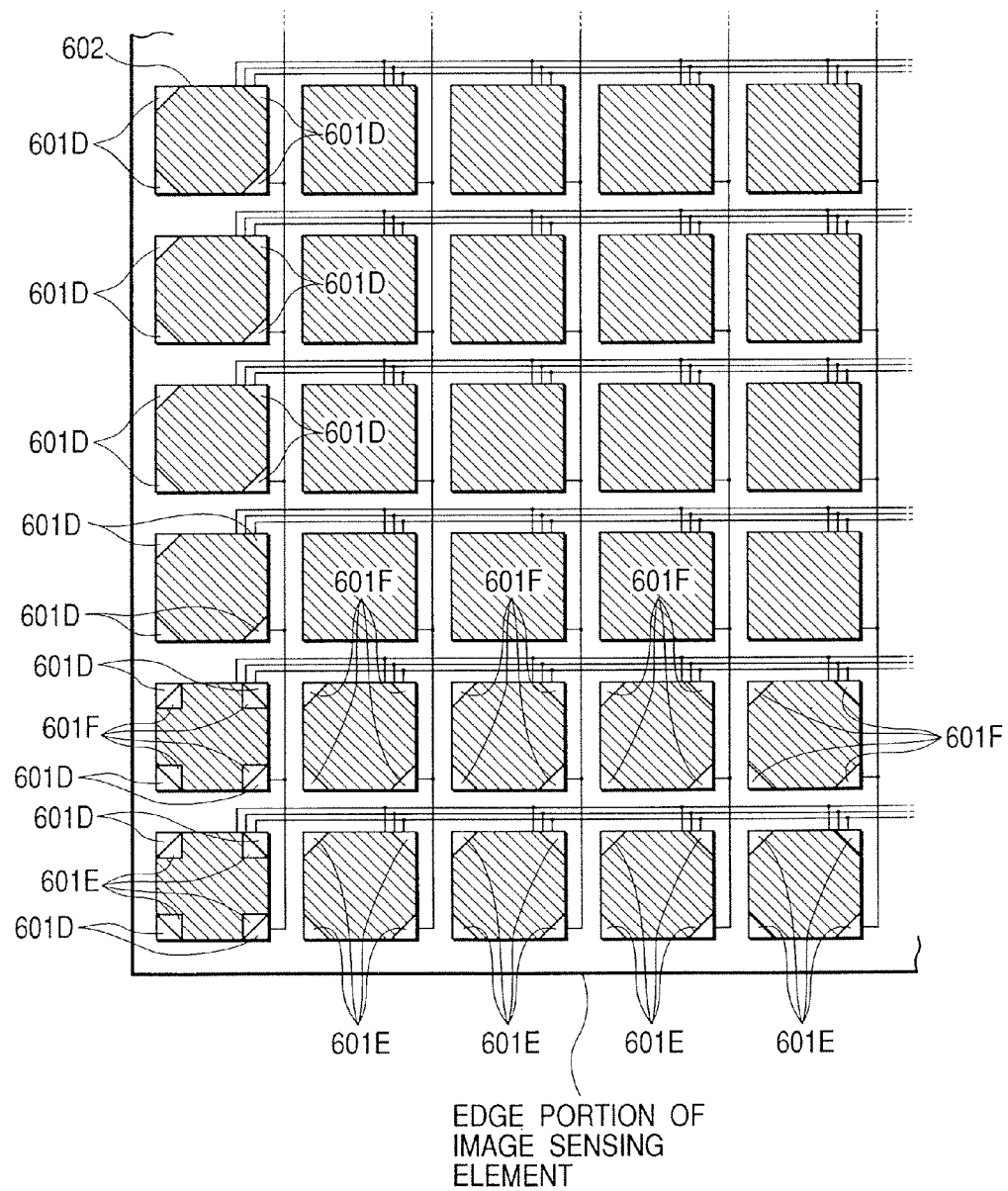
FIG. 26 is a plan view showing a layout of the image sensing elements according to the seventh embodiment of the present invention.

FIG. 26 shows a configuration (plan view) of an image sensing element of this embodiment.

Reference numeral 601D denotes circuits for one row of vertical scanning circuits, 601E denotes circuits for one column of horizontal scanning circuits and 601F denotes circuits for one column of common processing circuits. The centroid of the photoelectric section 602 in which the circuits 601D are arranged in the four corners is identical with the centroid of the photoelectric conversion section 602 in which the circuits 601D are not arranged. Similarly, the centroid of the photoelectric conversion section 602 in which the circuits 601E are arranged in the four corners is identical with the centroid of the photoelectric conversion section 602 in which the circuits 601E are not arranged. The centroid of the photoelectric conversion section 602 in which the circuits 601F are arranged in the four corners is identical with the centroid of the photoelectric conversion section 602 in which the circuits 601F are not arranged. Moreover, the centroid of the photoelectric conversion section 602 in which the circuits 601D and the circuits 601E are arranged in the four corners of the photoelectric conversion section 602 is identical with the centroid of the photoelectric conversion section 602 in which the circuits 601D and the circuits 601E are not arranged. Similarly, the centroid of the photoelectric conversion section 602 in which the circuits 601D and the circuits 601F are arranged in the four corners of the photoelectric conversion section 602 is identical with centroid of the photoelectric conversion section 602 in which the circuits 601D and the circuits 601F are not arranged. On the other hand, when the circuits 601D, 601E and 601F are not arranged, the centroids of the photoelectric conversion sections 602 are arranged at equal intervals. Therefore, the centroids of the photoelectric conversion sections 602 are arranged at equal intervals even if the circuits 601D, 601E and 601F are arranged.

An image sensing apparatus of the eighth embodiment is the same as the sixth embodiment in a basic configuration and is different from the sixth embodiment in a format of arranging a scanning circuit and a common processing circuit.

Figure 27:
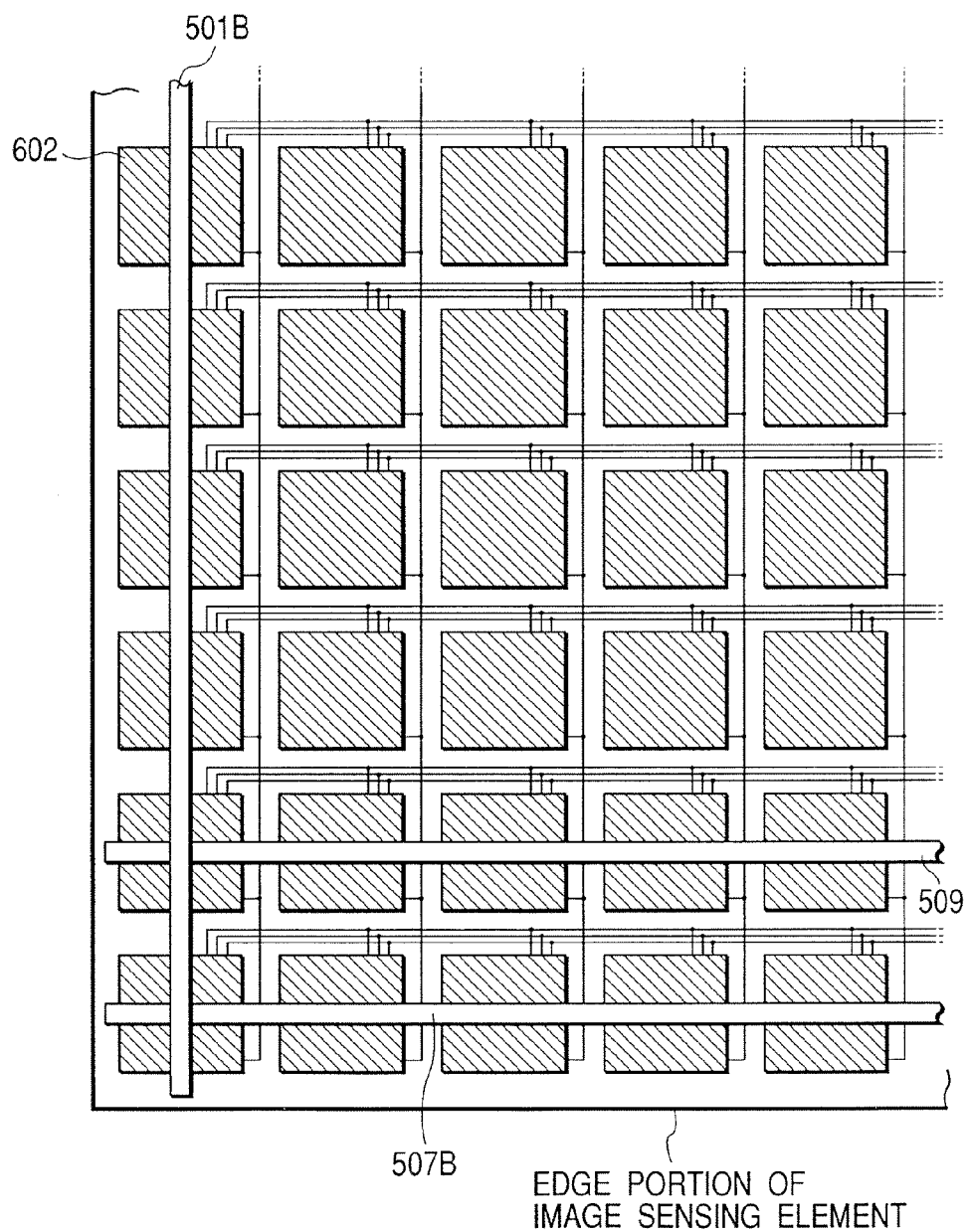
FIG. 27 is a plan view showing a layout of the image sensing elements according to the eighth embodiment of the present invention.

FIG. 27 shows a configuration (plan view) of an image sensing element of this embodiment.

Reference numeral 501B denotes a vertical scanning circuit, 507B denotes a horizontal scanning circuit, and 509 denotes a common processing circuit. The centroid of the photoelectric section 602 in which the vertical scanning circuit 501B is arranged in the center is identical with the centroid of the photoelectric conversion section 602 in which the vertical scanning circuit 501B is not arranged. Similarly, the centroid of the photoelectric conversion section 602 in which the horizontal scanning circuit 507B is arranged in the center is identical with the centroid of the photoelectric conversion section 602 in which the horizontal scanning circuit 507B is not arranged. The centroid of the photoelectric conversion section 602 in which the common processing circuit 509 is arranged in the center is identical with the centroid of the photoelectric conversion section 602 in which the common processing circuit 509 is not arranged. Moreover, the centroid of the photoelectric conversion section 602 in which the vertical scanning circuit 501B and the horizontal scanning circuit 507B are arranged in the center is identical with centroid of the photoelectric conversion section 602 in which the vertical scanning circuit 501B and the horizontal scanning circuit 507B are not arranged. Similarly, the centroid of the photoelectric conversion section 602 in which the vertical scanning circuit 501B and the common processing circuit 509 are arranged in the center is identical with centroid of the photoelectric conversion section 602 in which the vertical scanning circuit 501B and the common processing circuit 509 are not arranged. On the other hand, when the vertical scanning circuit 501B, the horizontal scanning circuit 507B and the common processing circuit 509 are not arranged, the centroids of the photoelectric conversion sections 602 are arranged at equal intervals. Therefore, the centroids of the photoelectric conversion sections 602 are arranged at equal intervals even if the vertical scanning circuit 501B, the horizontal scanning circuit 507B and the common processing circuit 509 are arranged.

Further, since scanning circuits and common processing circuits are not divided in this embodiment, a power supply line can be arranged on the scanning circuits and/or the common processing circuits for shielding X-ray. As a material of the power supply line, copper or the like, which has high absorptance is used.

Scanning circuits and common processing circuits are arranged inside a photoelectric conversion section such that the centroid of the photoelectric conversion section does not move in the sixth to the eighth embodiments. On the other hand, in the ninth embodiment, a light shielding section is arranged in such manner that it covers a part of a photoelectric conversion section, and the light shielding section is arranged inside the photoelectric conversion section such that the centroid of the photoelectric conversion section does not move. In addition, scanning circuits and common processing circuits are provided below the light shielding section. Further, the light shielding section consists of, for example, a metal for wiring. In this embodiment, even if circuits for each row or each column of the scanning circuits are not formed in an identical shape to each other, the movement of the centroid of the photoelectric conversion section can be prevented by devising the arrangement of the light shielding section. In addition, even if circuits for each column of the common processing circuit are not formed in an identical shape to each other, the movement of the centroid of the photoelectric conversion section can be prevented by devising the arrangement of the light shielding section.

Figure 28:
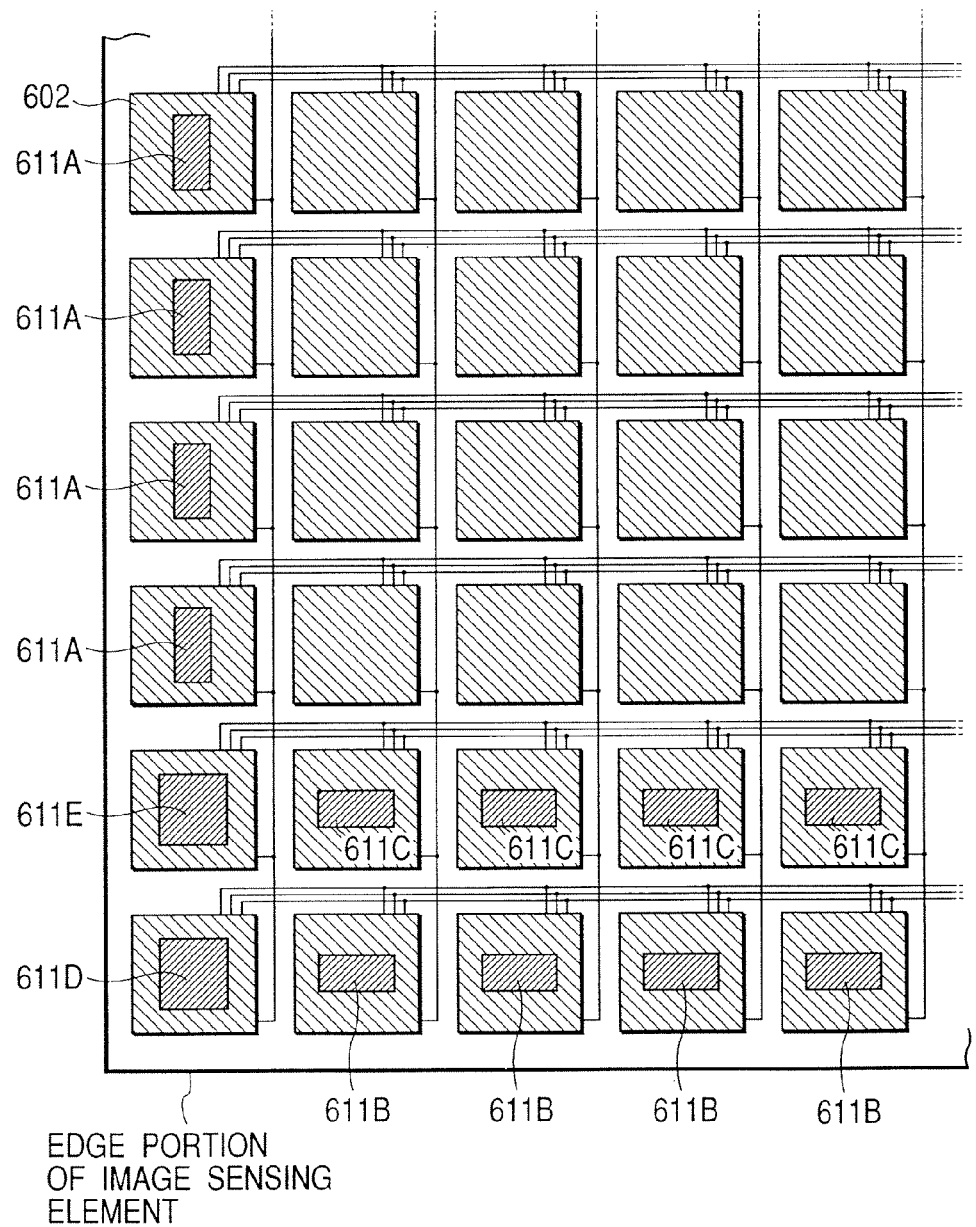
FIG. 28 is a plan view showing a layout of the image sensing elements according to the ninth embodiment.

FIG. 28 shows a configuration (plan view) of an image sensing apparatus of the ninth embodiment.

Reference numeral 611A denotes a light shielding section for covering circuits for one row of vertical scanning circuits, 611B denotes a light shielding section for covering circuits for one column of horizontal scanning circuits, and 611C denotes a light shielding section for covering circuits for one column of common processing circuits. In addition, reference numeral 611D denotes a light shielding section for covering circuits for one row of the vertical scanning circuits and circuits for one column of the horizontal scanning circuits, and 611E denotes a light shielding section for covering circuits for one row of the vertical scanning circuits and circuits for one column of the common processing circuits. The centroid of the photoelectric conversion section 602 in which the light shielding section 611A is arranged in the center is identical with the centroid of the photoelectric conversion section 602 in which the light shielding section 611A is not arranged.

Similarly, the centroids of the photoelectric conversion sections 602 in which the light shielding sections 611B, 611C, 611D and 611E are arranged in the center, respectively, are identical with the centroids of the photoelectric conversion section 602 in which the light shielding sections 611B, 611C, 611D and 611E are not arranged. On the other hand, if the light shielding sections 611A to 611E are not arranged, the centroids of the photoelectric sections 602 are arranged at equal intervals. Therefore, even if the light shielding sections 611A to 611E are arranged, the centroids of the photoelectric conversion sections 602 are arranged at equal intervals.

In the ninth embodiment, a light shielding section is arranged only in a photoelectric conversion section in which scanning circuits and/or common processing circuits are arranged. In a tenth embodiment, a light shielding section is arranged either in a photoelectric conversion section in which scanning circuits and/or common processing circuits are arranged or in a photoelectric conversion section in which scanning circuits and common processing circuits are not arranged. That is, the light shielding section is arranged in any photoelectric conversion section.

Figure 29:
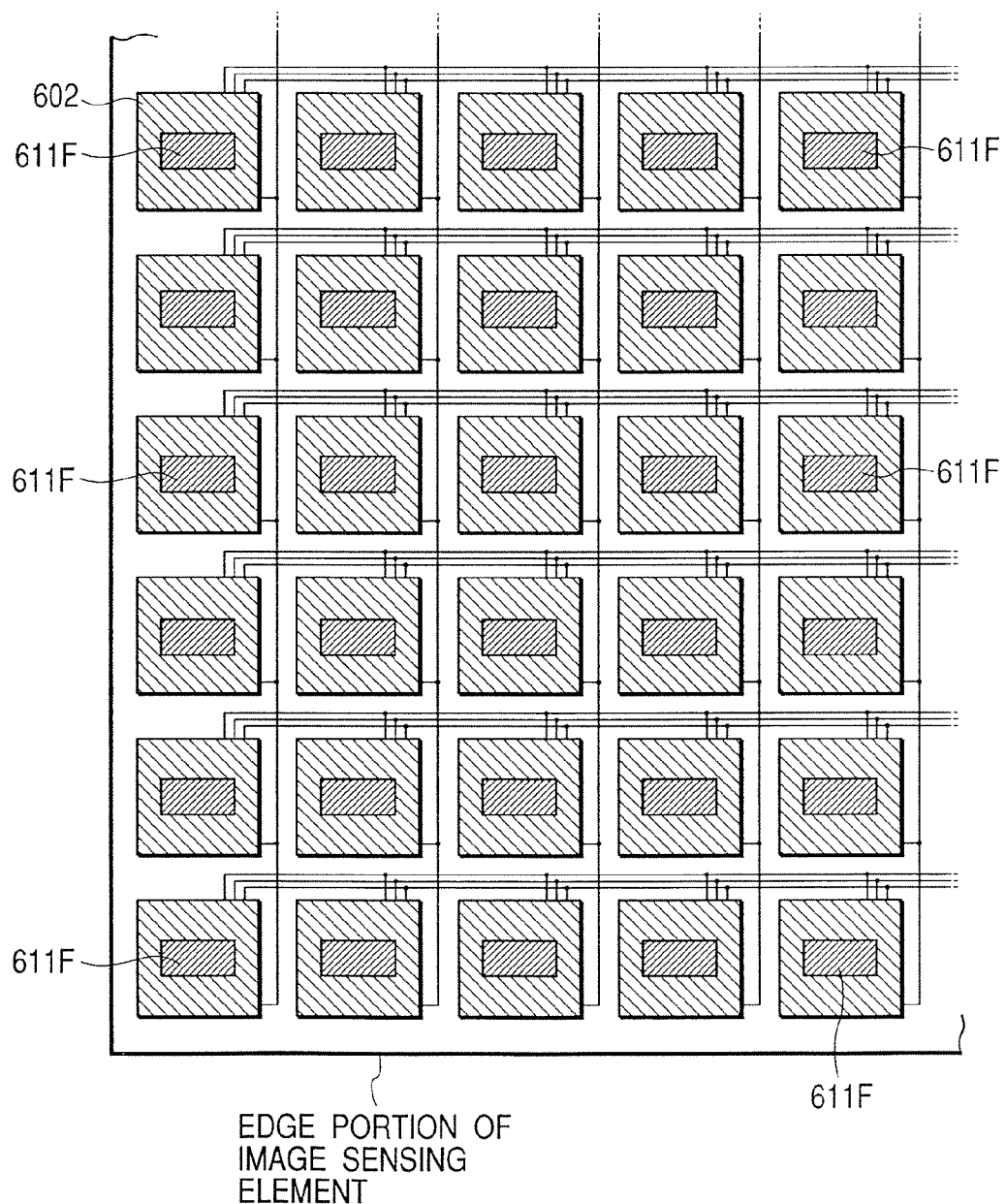
FIG. 29 is a plan view showing a layout of the image sensing elements according to the tenth embodiment of the present invention.

FIG. 29 shows a configuration (plan view) of an image sensing element of this embodiment.

Reference numeral 611F denotes light shielding sections, which are arranged in all photoelectric conversion sections. Parts of the light shielding sections (e.g., the light shielding section which is in the position of the light shielding section 611A) cover circuits for one row of vertical scanning circuits. In addition, another part of the light shielding sections (e.g., the light shielding section which is in the position of the light shielding section 611B) cover circuits for one column of horizontal scanning circuits. Moreover, another part of the light shielding sections (e.g., the light shielding section which is in the position of the light shielding section 611C) cover circuits for one column of common processing circuits. Moreover, another part of the light shielding sections (e.g., the light shielding section which is in the position of the light shielding section 611D) cover circuits for one row of the vertical scanning circuit and circuits for one column of the horizontal scanning circuits. Furthermore, another part of the light shielding sections (e.g., the light shielding section which is in the position of the light shielding section 611E) cover circuits for one row of the vertical scanning circuits and circuits for one column of the common processing circuits. The centroid of the photoelectric conversion section 602 in which the light shielding section 611F is arranged in the center is identical with the centroid of the photoelectric conversion section 602 in which the light shielding section 611A is not arranged. On the other hand, when the light shielding sections 611F are not arranged, the centroids of the photoelectric conversion section 602 are arranged at equal intervals. Therefore, even if the light shielding sections 611F are arranged, the centroids of the photoelectric conversion section 602 are arranged at equal intervals.

In the tenth embodiment, the light shielding section 611F is arranged in the center of the photoelectric conversion section 602 such that the centroid of the photoelectric conversion section 602 does not move. However, it is not always necessary to dispose a light shielding section such that the centroid of the photoelectric conversion section 602 does not move, as long as the condition that the centroids of the photoelectric conversion sections 602 in which the light shielding sections be arranged at equal intervals is satisfied and if the light shielding sections are arranged in all the photoelectric conversion sections 602.

Figure 30:
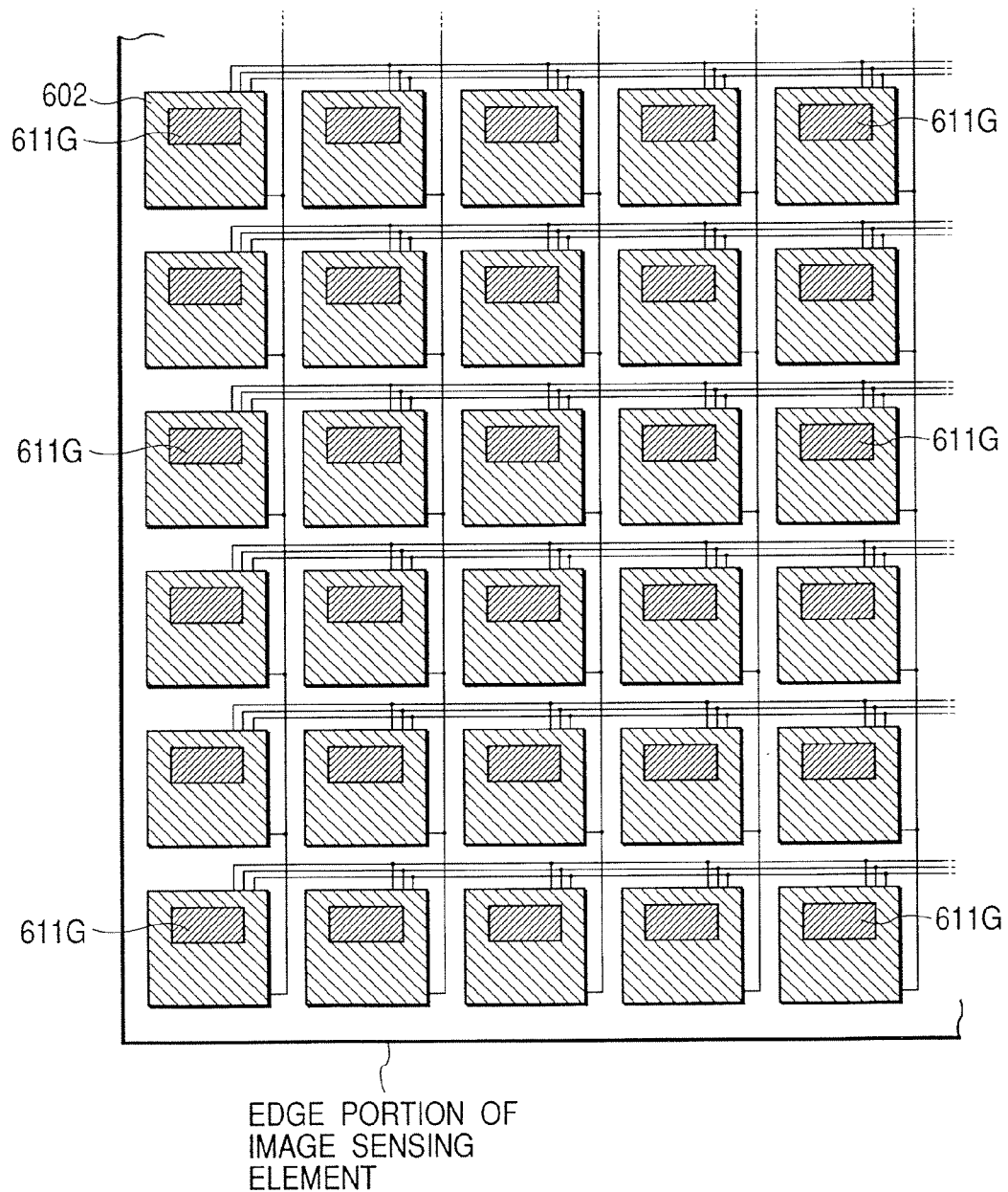
FIG. 30 is a plan view showing a layout of the image sensing elements according to the eleventh embodiment of the present invention.

FIG. 30 shows a configuration (plan view) of an image sensing element of an eleventh embodiment.

Reference numeral 611G denotes light shielding sections, which are arranged in all photoelectric conversion sections. Parts of the light shielding sections (e.g., the light shielding section which is in the position of the light shielding section 611A) cover circuits for one row of vertical scanning circuits. In addition, another part of the light shielding sections (e.g., the light shielding section which is in the position of the light shielding section 611B) cover circuits for one column of horizontal scanning circuits. Moreover, another part of the light shielding sections (e.g., the light shielding section which is in the position of the light shielding section 611C) cover circuits for one column of common processing circuits. Moreover, another part of the light shielding sections (e.g., the light shielding section in the position of the light shielding section 611D) cover circuits for one row of the vertical scanning circuits and circuits for one column of the horizontal scanning circuits. Furthermore, another part of the light shielding sections (e.g., the light shielding section in the position of the light shielding section 611E) cover circuits for one row of the vertical scanning circuits and circuits for one column of the common processing circuits.

In this embodiment, the light shielding section 611G is arranged such that the centroid of the photoelectric conversion section 602 moves. However, since the light shielding sections 611G are arranged in all the photoelectric conversion section 602, and moving directions and moving amounts of the centroids of the photoelectric conversion sections 602 in which the light shielding sections 611G are arranged are equal, the centroids of the photoelectric conversion sections 602 are arranged at equal intervals even if the light shielding sections 611G are provided.

As described above, according to the sixth to the eleventh embodiments, using an entire surface of an image sensing element as an effective pixel area, and scanning circuits and common processing circuits are arranged inside a photoelectric conversion section for each pixel in the effective pixel area. In addition, using an entire surface of an image sensing element as an effective image sensing area, a light shielding section is arranged inside a photoelectric conversion section for each pixel in the effective pixel area, and scanning circuits and common processing circuits are arranged below it. Therefore, since image sensing elements can be arranged such that a substantial gap is not generated between the image sensing elements, discontinuity or lack of an image does not occur between the image sensing elements even if an entire circumference of a given image sensing element is surrounded by other image sensing elements to configure an image sensing apparatus which forms one image by five (in the case of a crucifix-shaped area) or nine (in the case of a rectangular area of 3/row×3/column) or more image sensing elements.

In addition, it has become possible to arrange centroids of photoelectric conversion sections at equal intervals by carefully devising an arrangement of scanning circuits, common processing circuits and light shielding sections inside the photoelectric conversion sections. Therefore, it has become possible to avoid problems of distortion of images due to arrangement of centroids of photoelectric conversion sections at unequal intervals.

Figure 31:
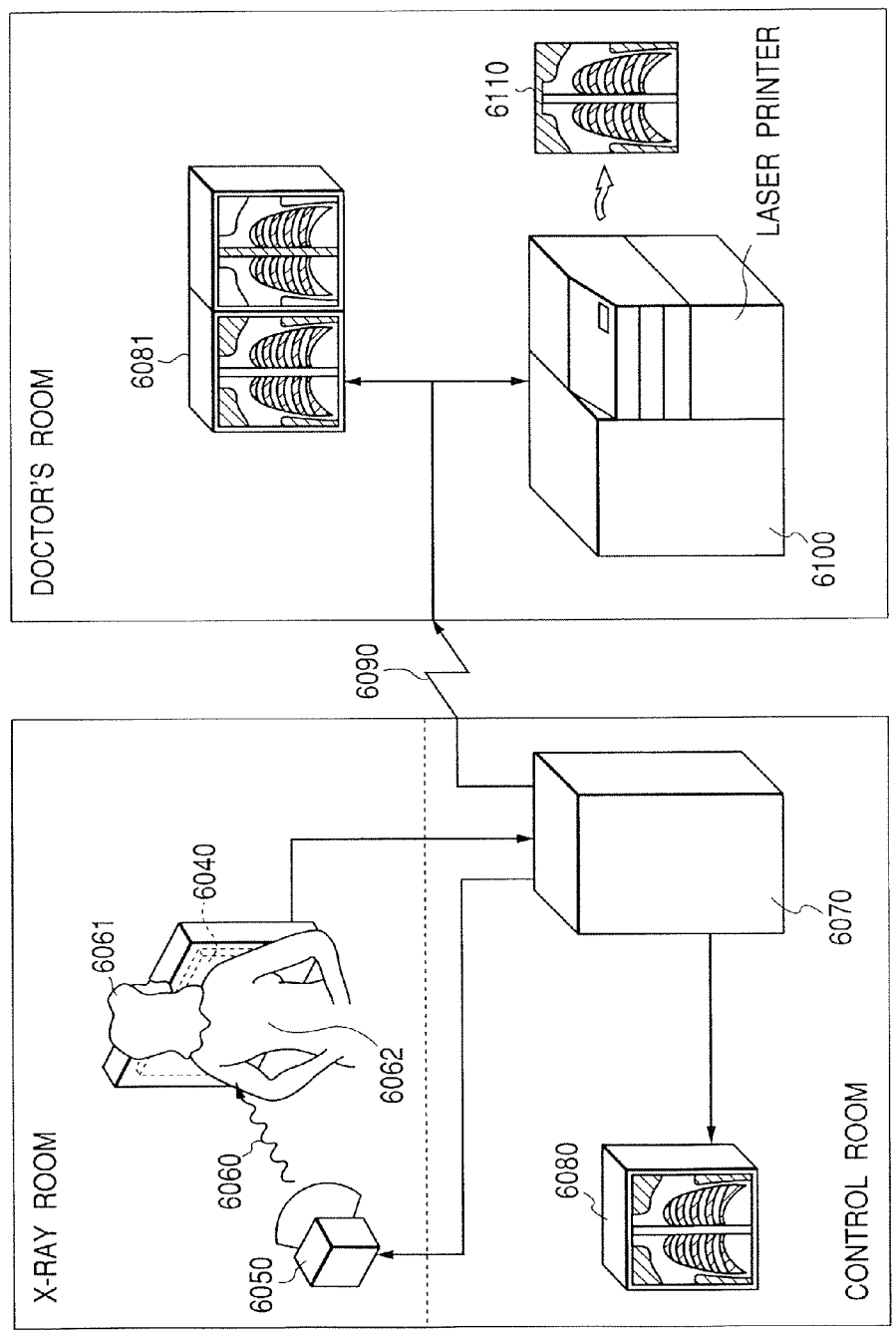
FIG. 31 is a conceptual view showing a configuration of an X-ray diagnosis system according to the twelfth embodiment of the present invention.

FIG. 31 shows a twelfth embodiment that is an example of an application of the image sensing apparatus of the first to the eleventh embodiments to an X-ray diagnosis system.

X-ray 6060 generated by an X-ray tube 6050 penetrates a chest 6062 of a patient or an object 6061 and is incident on a radiation image sensing apparatus 6040 provided with the scintillator 201, the FOP 202, the image sensing element 101 and the external processing substrate 204. The incident X-ray includes information of the inside of the body of the patient 6061. The scintillator emits light in response to the incidence of the X-ray, the light is photoelectrically converted by the image sensing element, and electric information is obtained. This information is digitally converted, subject to image processing by an image processor 6070 and observed on a display 6080 in a control room.

In addition, this information can be transferred to a distant place by transferring means such as telephone lines 6090, can be indicated on a display 6081 or saved in saving means such as an optical disk in a doctor's room in another place, and enables a doctor in the distant place to make a diagnosis. In addition, the information can be recorded in a film 6110 by a film processor 6100.

As many apparently widely different embodiments of the present invention can be made without departing from the spirit and scope thereof, it is to be understood that the invention is not limited to the specific embodiments thereof except as defined in the appended claims.

What is claimed is:

1. An image sensing apparatus comprising:
    an effective pixel area arranged with a plurality of pixels, each pixel having a photoelectric conversion section and a transistor;
    a scanning circuit arranged in the effective pixel area and connected to a gate of the transistor, and having a plurality of unit blocks; and
    light shielding sections for covering the unit blocks of the scanning circuit.

2. An image sensing apparatus according to claim 1, wherein the scanning circuit is provided with a shift register.

3. An image sensing apparatus according to claim 2, wherein the shift register is a static type.

4. An image sensing apparatus according to claim 1, wherein the scanning circuit is provided with a decoder.

5. An image sensing apparatus according to claim 1, further comprising:
    a scintillator plate;
    a signal processing circuit constructed to process signals from the photoelectric conversion sections; and
    a radiation source constructed to generate radiation.

6. An image sensing apparatus comprising:
    an effective pixel area arranged with a plurality of pixels, each pixel having a photoelectric conversion section and a transistor;
    light shielding sections disposed within each of a part of the plurality of photoelectric conversion sections, wherein centroids of the photoelectric conversion sections in which the light shielding sections are disposed, are arranged at equal intervals; and
    a scanning circuit arranged in the effective pixel area and connected to a gate of the transistor, and having a plurality of unit blocks, wherein the plurality of unit blocks are disposed under the light shielding sections.

7. An image sensing apparatus according to claim 6, wherein the scanning circuit is provided with a shift register.

8. An image sensing apparatus according to claim 7, wherein the shift register is a static type.

9. An image sensing apparatus according to claim 6, wherein the scanning circuit is provided with a decoder.

10. An image sensing apparatus according to claim 6, further comprising:
    a scintillator plate;
    a signal processing circuit constructed to process signals from the photoelectric conversion sections; and
    a radiation source constructed to generate radiation.

* * * * *